United States Patent
Bocharov et al.

(10) Patent No.: US 9,208,280 B2
(45) Date of Patent: Dec. 8, 2015

(54) METHOD AND SYSTEM FOR OPTIMAL DECOMPOSITION OF SINGLE-QUBIT QUANTUM CIRCUITS USING STANDARD QUANTUM GATES

(71) Applicant: Microsoft Technology Licensing, LLC, Redmond, WA (US)

(72) Inventors: Alexei Bocharov, Redmond, WA (US); Krysta Svore, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/415,572

(22) PCT Filed: Jul. 18, 2013

(86) PCT No.: PCT/US2013/051171
§ 371 (c)(1),
(2) Date: Jan. 16, 2015

(87) PCT Pub. No.: WO2014/015200
PCT Pub. Date: Jan. 23, 2014

(65) Prior Publication Data
US 2015/0186587 A1 Jul. 2, 2015

Related U.S. Application Data

(63) Continuation of application No. 13/552,641, filed on Jul. 19, 2012, now abandoned.

(51) Int. Cl.
*G06F 17/50* (2006.01)
*G06N 99/00* (2010.01)
*B82Y 10/00* (2011.01)

(52) U.S. Cl.
CPC .......... *G06F 17/5072* (2013.01); *B82Y 10/00* (2013.01); *G06F 17/505* (2013.01); *G06F 17/5045* (2013.01); *G06N 99/002* (2013.01)

(58) Field of Classification Search
USPC .......................................... 716/101, 104, 132
See application file for complete search history.

(56) References Cited

U.S. PATENT DOCUMENTS

| | | | | |
|---|---|---|---|---|
| 2002/0038313 | A1* | 3/2002 | Klein et al. | 707/200 |
| 2006/0123363 | A1* | 6/2006 | Williams et al. | 716/1 |
| 2009/0164435 | A1* | 6/2009 | Routt | 707/3 |

(Continued)

OTHER PUBLICATIONS

Amy et al., "A meet-in-the-middle algorithm for fast synthesis of depth-optimal quantum circuits," University of Waterloo (Jun. 6, 2012).

(Continued)

*Primary Examiner* — Brian Ngo
(74) *Attorney, Agent, or Firm* — Steve Wight; Sandy Swain; Micky Minhas

(57) ABSTRACT

The current application is directed to methods and systems which produce a design for an optimal approximation of a target single-qubit quantum operation comprising a representation of a quantum-circuit generated from a discrete, quantum-gate basis. The discrete quantum-gate basis comprises standard, implementable quantum gates. The methods and systems employ a database of canonical-form quantum circuits, an efficiently organized canonical-form quantum-circuit, and efficient searching to identify a minimum-cost design for decomposing and approximating an input target quantum operation.

17 Claims, 29 Drawing Sheets

(56) References Cited

U.S. PATENT DOCUMENTS

2009/0282211 A1* 11/2009 Hoover et al. ................ 711/173
2012/0284331 A1* 11/2012 Kambatla et al. ............. 709/204

OTHER PUBLICATIONS

Final Office action from U.S. Appl. No. 13/552,641, dated Mar. 28, 2014, 8 pages.
Hung et al., "Optimal Synthesis of Multiple Output Boolean Functions Using a Set of Quantum Gates by Symbolic Reachability Analysis," *IEEE Transactions on Computer-Aided Design of Integrated Circuits and Systems*, 25:1652-1663 (Sep. 2006).
International Search Report and Written Opinion from International Application No. PCT/US2013/051171, dated Nov. 13, 2013, 14 pages.
Matsumoto et al., "Representation of Quantum Circuits with Clifford and $\pi/8$ Gates," Retrieved from the Internet on Oct. 8, 2013: URL:http://arxiv.org/pdf/0806.3834v1, pp. 1-17 (Jun. 24, 2008).
Non-final Office action from U.S. Appl. No. 13/552,641, dated Mar. 19, 2013, 13 pages.
Non-final Office action from U.S. Appl. No. 13/552,641, dated Aug. 29, 2013, 7 pages.
Ruican et al., "Automatic Synthesis for Quantum Circuits Using Genetic Algorithms," Adaptive and Natural Computing Algorithms, 8th International Conference, pp. 174-183 (2007).

* cited by examiner

| | |
|---|---|
| $G_0$ | Id |
| $G_1$ | H |
| $G_2$ | HSSH |
| $G_3$ | SS |
| $G_4$ | S |
| $G_5$ | SSS |
| $G_6$ | HSS |
| $G_7$ | SSH |
| $G_8$ | SH |
| $G_9$ | SSSH |
| $G_{10}$ | SSHSSH |
| $G_{11}$ | SHSSH |
| $G_{12}$ | SSSHSSH |
| $G_{13}$ | HS |
| $G_{14}$ | HSSS |
| $G_{15}$ | SSHSS |
| $G_{16}$ | SHSS |
| $G_{17}$ | SSSHSS |
| $G_{18}$ | HSH |
| $G_{19}$ | HSSSH |
| $G_{20}$ | HSHSSH |
| $G_{21}$ | HSSSHSSH |
| $G_{22}$ | SSSHS |
| $G_{23}$ | SHSSS |

| | |
|---|---|
| $G_0T$ | T |
| $G_1T$ | HT |
| $G_2T$ | $TG_{12}$ |
| $G_3T$ | $TG_3$ |
| $G_4T$ | $TG_4$ |
| $G_5T$ | $TG_5$ |
| $G_6T$ | $HTG_3$ |
| $G_7T$ | $HTG_{12}$ |
| $G_8T$ | $HSHTG_2$ |
| $G_9T$ | $HSHTG_4$ |
| $G_{10}T$ | $TG_{11}$ |
| $G_{11}T$ | $TG_2$ |
| $G_{12}T$ | $TG_{10}$ |
| $G_{13}T$ | $HTG_4$ |
| $G_{14}T$ | $HTG_5$ |
| $G_{15}T$ | $HTG_{11}$ |
| $G_{16}T$ | $HSHTG_{10}$ |
| $G_{17}T$ | $HSHTG_5$ |
| $G_{18}T$ | HSHT |
| $G_{19}T$ | $HSHTG_{12}$ |
| $G_{20}T$ | $HTG_2$ |
| $G_{21}T$ | $HTG_{10}$ |
| $G_{22}T$ | $HSHTG_3$ |
| $G_{23}T$ | $HSHTG_{11}$ |

FIG. 5C

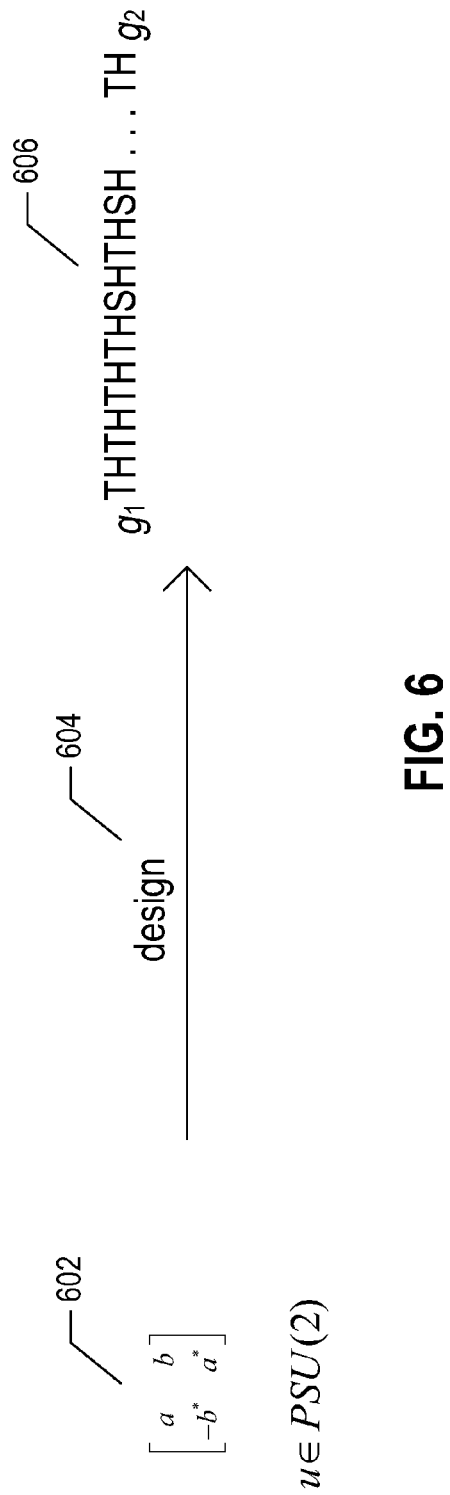

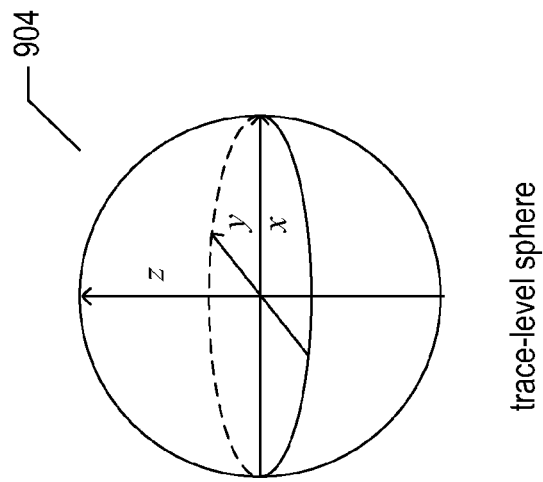
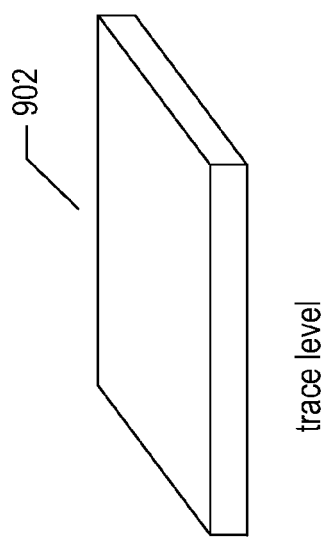
FIG. 9

METHOD AND SYSTEM FOR OPTIMAL DECOMPOSITION OF SINGLE-QUBIT QUANTUM CIRCUITS USING STANDARD QUANTUM GATES

CROSS REFERENCE TO RELATED APPLICATIONS

This is the U.S. National Stage of International Application No. PCT/US2013/051171, filed Jul. 18, 2013, which was published in English under PCT Article 21(2), which in turn is a continuation of U.S. application Ser. No. 13/552,641, filed Jul. 19, 2012, and is incorporated herein by reference in its entirety.

TECHNICAL FIELD

The current application is directed to quantum computing and, in particular, to a method and system for implementing a given single-qubit quantum circuit as a composition of standard, implementation-efficient single-qubit quantum gates.

BACKGROUND

Enormous advances have been made in digital computing over the past 70 years. Crude, high-energy-consuming, vacuum-tube-based computer systems developed in the 1940s have evolved into today's personal computers, work stations, servers, and high-end distributed computer systems, based on multi-core single-integrated-circuit processors, that economically provide processing speeds, data-storage capacities, and data-transfer bandwidths that were unimaginable even 20 years ago. However, digital computing appears to be bounded by certain physical and problem-domain constraints.

With regard to physical constraints, processing speeds and data-storage capacities are generally inversely related to the minimum sizes at which transistors and other circuit elements can be fabricated within integrated circuits. Much of the exponential growth observed in computational bandwidth for various classes of computer systems can be attributed to a corresponding decrease in feature sizes within integrated circuits. There are, however, fundamental physical limits, on the order of the sizes of complex molecules, past which feature sizes cannot be further decreased, and somewhat larger feature-size limitations past which further decreases in feature sizes can be obtained only by exponentially increasing integrated-circuit cost.

With regard to problem-domain constraints, while digital computers provide the basis for practical and cost-effective solutions of many types of computational problems, there are many types and classes of computational problems that appear incapable of being addressed efficiently by digital computer systems. Examples include accurate simulation of the quantum-mechanical behavior of large molecules and aggregations of molecules and a variety of traditional numerical and computational problems, including large-integer factoring and graph-isomorphism problems.

In 1982, Richard Feynman made a suggestion for a new type of computational system based on quantum-mechanical components. He suggested that quantum computers could more efficiently address certain classes of computational problems than digital computers and, in the case of computational problems in computational chemistry and physics, provide practical approaches to computational problems that are intractable using digital computer systems. Since that time, great progress has been made in developing the theoretical foundation for quantum computing and the first quantum computers have been implemented. Various computational problems have been identified that can be addressed more efficiently by quantum computers than by classical digital computers. However, significant research and development efforts continue to be applied in order to provide practical and cost-effective general-purpose quantum-computing systems for widespread use. As one example, significant theoretical efforts are currently being applied to identify cost-effective implementations of quantum circuits.

SUMMARY

The current application is directed to methods and systems which produce a design for an optimal approximation of a target single-qubit quantum operation comprising a representation of a quantum-circuit generated from a discrete, quantum-gate basis. The discrete quantum-gate basis comprises standard, implementable quantum gates. The methods and systems employ a database of canonical-form quantum circuits, an efficiently organized canonical-form quantum-circuit, and efficient searching to identify a minimum-cost design for decomposing and approximating an input target quantum operation.

BRIEF DESCRIPTION OF THE DRAWINGS

FIGS. 5A-C illustrate the group CPH.

FIG. 6 illustrates, at a high level, the quantum-circuit design method and system to which the current application is directed.

FIG. 9 illustrates a trace sphere.

DETAILED DESCRIPTION OF EMBODIMENTS

It should be noted, at the onset, that although the current application employs mathematical notation and control-flow diagrams, the current application is directed to a method and system for producing physical, tangible, digital representations of quantum circuits that are stored in physical data-storage devices and systems, including optical disks within optical-disk drives, magnetic disks within magnetic-disk drives, electronic memories within computer systems, and other such physical, tangible data-storage devices. Furthermore, the quantum-circuit representations produced by methods and systems disclosed in the current application provide for the design of quantum circuits, the cost-effectiveness of which can be directly physically measured by the amount of data-storage-device capacity needed to store the quantum-circuit representations, by the cost in time and energy consumption in computing the representations for the quantum circuits, by the cost of implementing the quantum circuits programmatically or in hardware design, and by the time and energy consumed by the implemented quantum circuits. In other words, the current application is directed to real-world methods and systems of real-world utility that produce physical and physically measurable results. The following discussion includes four different subsections: (1) Overview of Digital Computer Systems; (2) Overview of Quantum Computing; and (3) Normalization and Canonical-form Quantum Circuits; and (4) Quantum-Circuit-Design Methods and Systems. Those familiar with classical and quantum computing may wish to proceed to the final two subsections.

Overview of Digital Computer Systems

Figure 1:
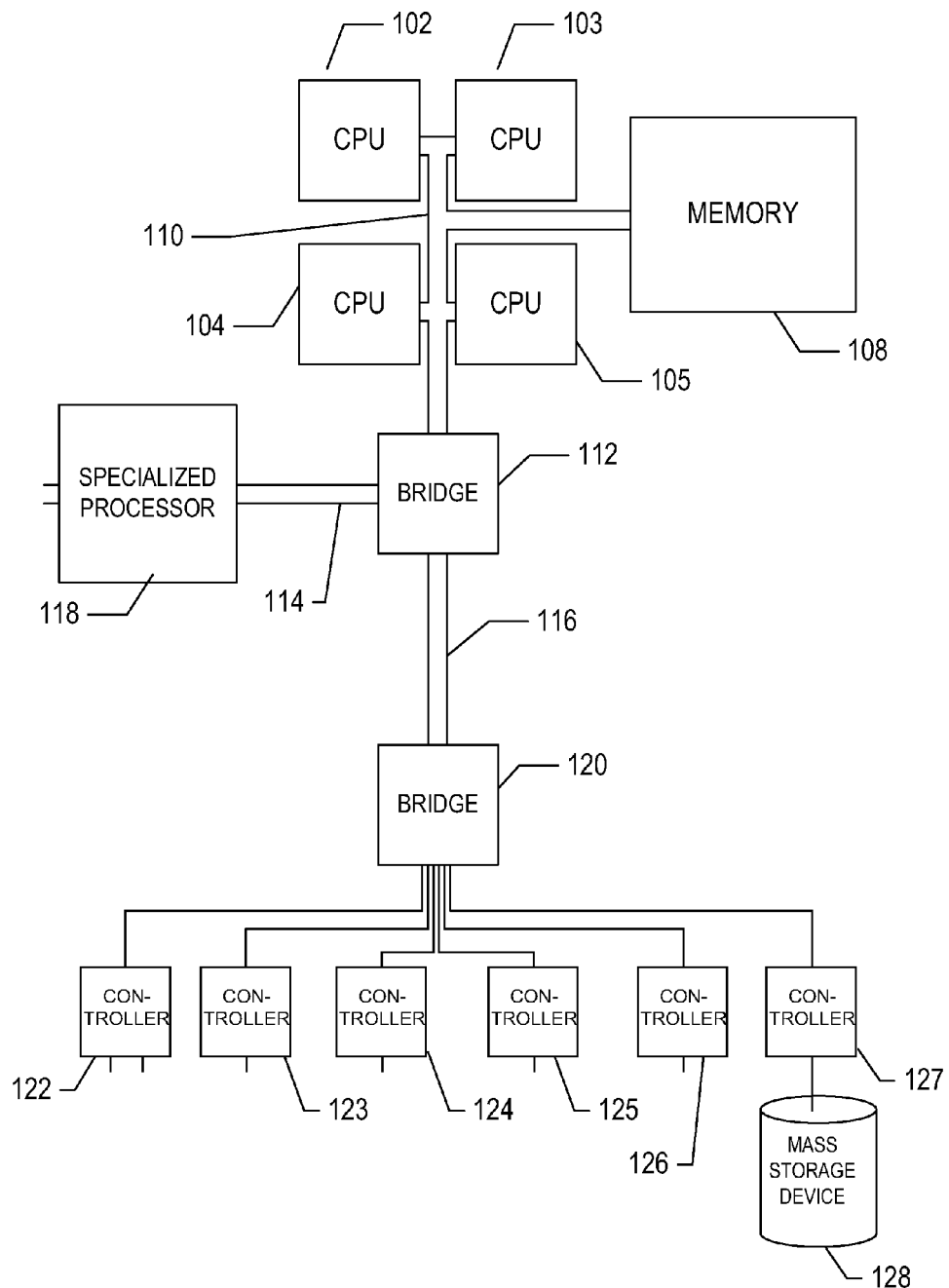
FIG. 1 provides an architectural diagram for a generalized digital computer that, when executing a control program that controls the computer system to generate normal representations of quantum circuits, represents a system to which the current application is directed.

FIG. 1 provides an architectural diagram for a generalized digital computer that, when executing a control program that controls the computer system to generate normal representations of quantum circuits, represents a system to which the current application is directed. The computer system contains one or multiple central processing units ("CPUs") 102-105, one or more electronic memories 108 interconnected with the CPUs by a CPU/memory-subsystem bus 110 or multiple busses, a first bridge 112 that interconnects the CPU/memory-subsystem bus 110 with additional busses 114 and 116 or other types of high-speed interconnection media, including multiple, high-speed serial interconnects. These busses or serial interconnections, in turn, connect the CPUs and memory with specialized processors, such as a graphics processor 118, and with one or more additional bridges 120, which are interconnected with high-speed serial links or with multiple controllers 122-127, such as controller 127, that provide access to various different types of mass-storage devices 128, electronic displays, input devices, and other such components, subcomponents, and computational resources. Digital computer systems store and manipulate information represented as binary numbers, or digits, of various lengths.

Overview of Quantum Computing

FIGS. 2A-D illustrate a quantum bit, referred to as a "qubit," which is a fundamental data-storage unit of many quantum-computing systems. The qubit is a quantum-computing analog of a classical digital-computer-system bit. A classical bit is considered to occupy, at any given point in time, one of two possible states corresponding to the binary digits "0" and "1." Of course, the classical bit is a high-level abstraction of a hardware implementation of the classical bit and, at the molecular level, the transistors and other circuit components and wiring that together compose a classical bit have an infinite number of quantum-mechanical states. Nonetheless, the complex quantum-mechanical states of a hardware implementation of a classical bit fall into two discrete and measureable subspaces that, in the aggregate, correspond to discrete and differentiable macroscopic states corresponding to binary digits "0" and "1."

By contrast, a qubit is implemented in hardware by tiny, physical components with quantum-mechanical characteristics that are generally contained within macroscopic subsystems. These tiny physical components can have an infinite number of different quantum-mechanical states. When the state of a qubit is physically measured, the measurement produces one of two different basis states $|0\rangle$ and $|1\rangle$. The quantum-mechanical state of a qubit is represented as a state vector representing a superposition of the two states $|0\rangle$ and $|1\rangle$:

$$|\psi\rangle = \alpha|0\rangle + \beta|1\rangle$$

where $\alpha$ and $\beta$ are complex numbers and $|\alpha|^2+|\beta|^2=1$. The qubit state vector can be represented in vector notation as:

$$|\psi\rangle = \begin{bmatrix} \alpha \\ \beta \end{bmatrix}.$$

The choice of vector representations of the states $|0\rangle$ and $|1\rangle$ is somewhat arbitrary, but to facilitate mathematical operations, these two vectors are generally chosen to be orthonormal and are often assigned the vector representations:

$$|0\rangle = \begin{bmatrix} 1 \\ 0 \end{bmatrix}$$

$$|1\rangle = \begin{bmatrix} 0 \\ 1 \end{bmatrix}.$$

The notation $|\ \rangle$ is, in the Dirac notation, referred to as the "ket" notation for vectors of an inner-product vector space. This inner-product vector space has a dual inner-product vector space, the vectors of which are represented by the Dirac bra notation $\langle\ |$. The corresponding dual-inner-product vector space vectors for the above-discussed qubit state vectors are:

$$\langle\psi| = [\alpha^*, \beta^*]$$

$$\langle 0| = [1,0]$$

$$\langle 1| = [0,1]$$

where $\alpha^*$ is the complex conjugate of $\alpha$. The magnitude of a qubit state vector is computed as the square root of the inner product of the state vector and its corresponding dual state vector:

$$|\langle\psi\|| = \sqrt{\langle\psi|\psi\rangle}$$
$$= \sqrt{\alpha\alpha^* + \beta\beta^*}$$
$$= 1.$$

Thus, state vectors used to describe qubit states are normalized to have a magnitude of 1, which is indicated by the "normal" syllable of the term "orthonormal." The "ortho" syllable refers to the fact that the state vectors $|0\rangle$ and $|1\rangle$ are chosen to be orthogonal, to simplify various operations, including taking inner products. Note that, by one convention, kets are represented by columns vectors and bras by row vectors. A complex row vector multiplied by a complex column vector, as in the above expression for the square root of the inner product of the state vector $|\psi\rangle$, produces a real number, while a column vector multiplied by a row vector produces a generally complex-valued matrix.

The quantum-mechanical state $|\psi\rangle$ of a qubit is not directly observable by measurement. Instead, physical measurement operations are performed on a qubit to produce a measured state in a computational basis, such as the basis $|0\rangle$ or $|1\rangle$. The measurement operations can be represented as 2×2 matrices $M_0$ and $M_1$:

$$M_0 = |0\rangle\langle 0| = \begin{bmatrix} 1 & 0 \\ 0 & 0 \end{bmatrix}$$

$$M_1 = |1\rangle\langle 1| = \begin{bmatrix} 1 & 0 \\ 0 & 0 \end{bmatrix}.$$

The probability that a measurement of a qubit in state $|\psi\rangle$ will return a state $|0\rangle$ or $|1\rangle$ is obtained by the inner product:

$$p_m = \langle\psi|M_m^\dagger M_m|\psi\rangle$$

where m is 0 or 1, corresponding to a measurement that produces $|0\rangle$ or $|1\rangle$, respectively. For example, the probability $p_0$ that a measurement of the state of a qubit in state $|\psi\rangle$ produces $|0\rangle$ is obtained as:

$$p_0 = \langle\psi|M_0^\dagger M_0|\psi\rangle$$
$$= [\alpha^*, \beta^*]\begin{bmatrix} 1 & 0 \\ 0 & 0 \end{bmatrix}\begin{bmatrix} \alpha \\ \beta \end{bmatrix} = \alpha\alpha^* = |\alpha|^2.$$

By a similar computation:

$$p_1 = |\beta|^2.$$

Thus, the squares of the magnitudes of the coefficients $\alpha$ and $\beta$ in the expression $|\psi\rangle = \alpha|0\rangle + \beta|1\rangle$ correspond to the probabilities that a measurement of a qubit in state $|\psi\rangle$ will produce states $|0\rangle$ and $|1\rangle$, respectively.

Figure 2A:
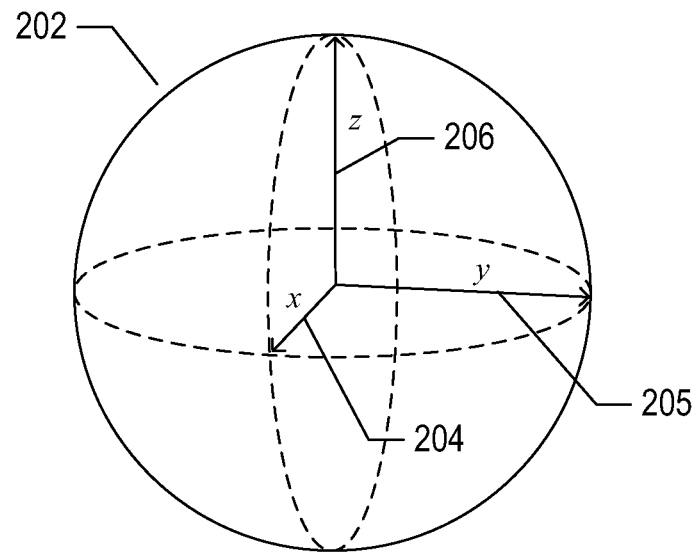
FIGS. 2A-D illustrate a quantum bit, referred to as a "qubit," which is a fundamental data-storage unit of many quantum-computing systems.
Figure 2B:
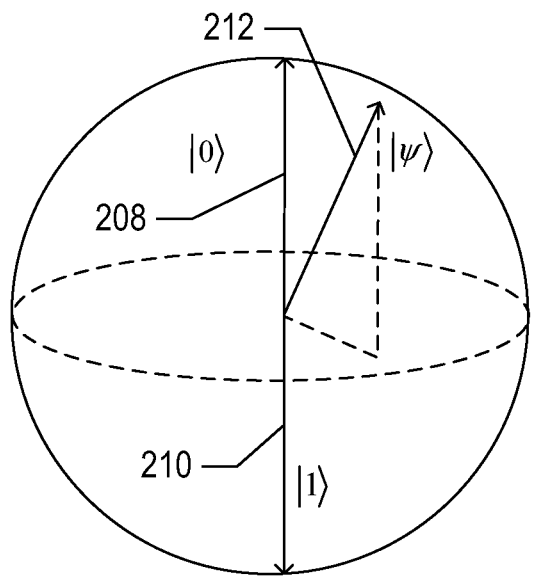

FIG. 2A shows a unit sphere 202 centered within a Cartesian coordinate system with orthonormal axes x 204, y 205, and z 206. The surface of this unit sphere represents all of the possible qubit state vectors $|\psi\rangle$ with unit modulus, analogous to the circle of an Argand diagram, discussed below, that represents all possible complex numbers of unit modulus. FIG. 2B shows an arbitrary qubit state vector $|\psi\rangle$ within the unit sphere shown in FIG. 2A. The vector of unit magnitude collinear with the positive z axis 208 is arbitrarily chosen to represent state vector $|0\rangle$ and the vector of unit magnitude co-linear with the negative z axis 210 is chosen to represent state vector $|1\rangle$. Pairs of points at which a line passing through the origin intersects the unit sphere correspond to orthogonal state vectors. An arbitrary single-qubit state vector $|\psi\rangle$ 212 is a linear combination of the two computational basis state vectors $|0\rangle$ and $|1\rangle$, as expressed by $|\psi\rangle = \alpha|0\rangle + \beta|1\rangle$, and can thus be any vector that can be inscribed within the unit sphere, with the particular vector corresponding to $|\psi\rangle$ depending on the values of $\alpha$ and $\beta$. The representation of the state of a qubit shown in FIG. 2B is referred to as a Bloch sphere.

Figure 2C:
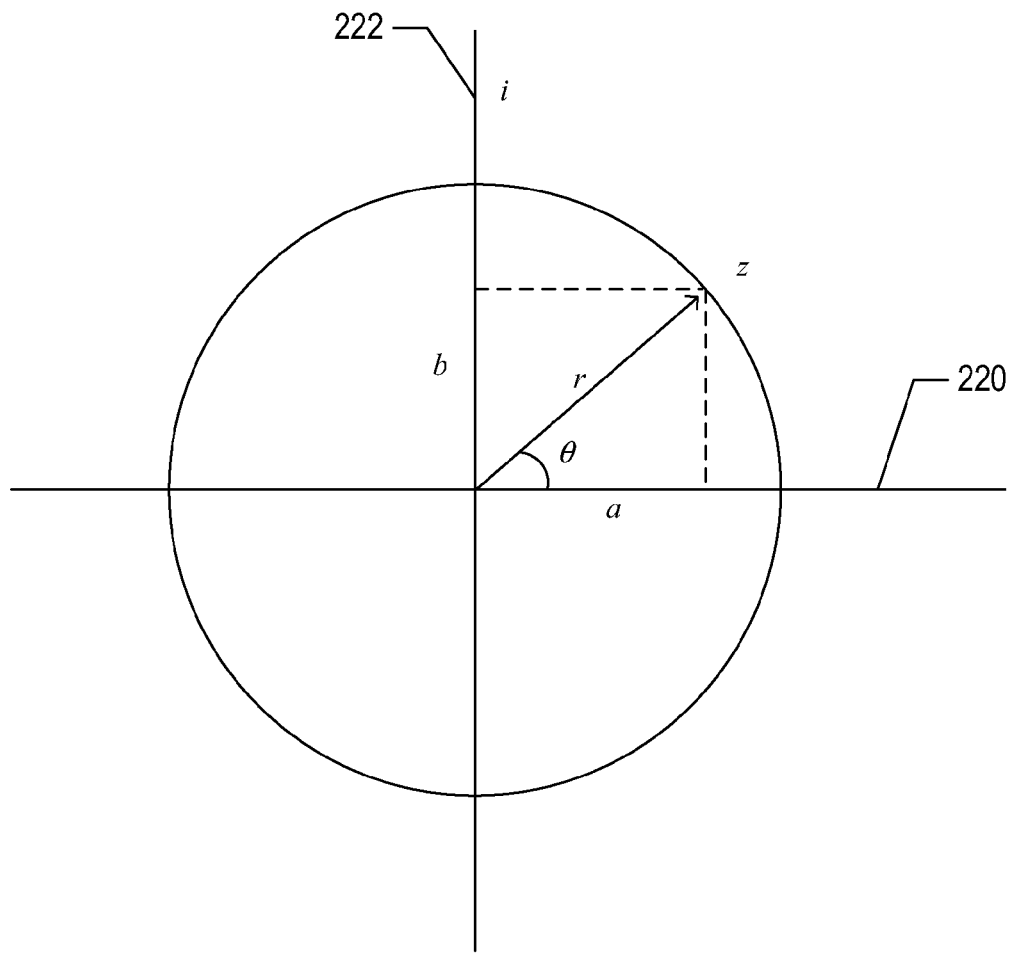

FIG. 2C shows the Argand diagram frequently used to illustrate various ways to represent a complex number. The horizontal axis 220 represents the real numbers and the vertical axis 222 represents the imaginary numbers. The general expression for a complex number z is:

$$z = a + ib$$

where a and b are real numbers and $i = \sqrt{-1}$. Because $$a = r\cos\theta$$

$$b = r\sin\theta,$$

as shown in FIG. 2C, the complex number z can be alternatively expressed in polar form as:

$$z = r(\cos\theta + i\sin\theta)$$
$$= re^{i\theta}$$
$$= e^{i\theta} \text{ for } |r| = 1..$$

Figure 2D:
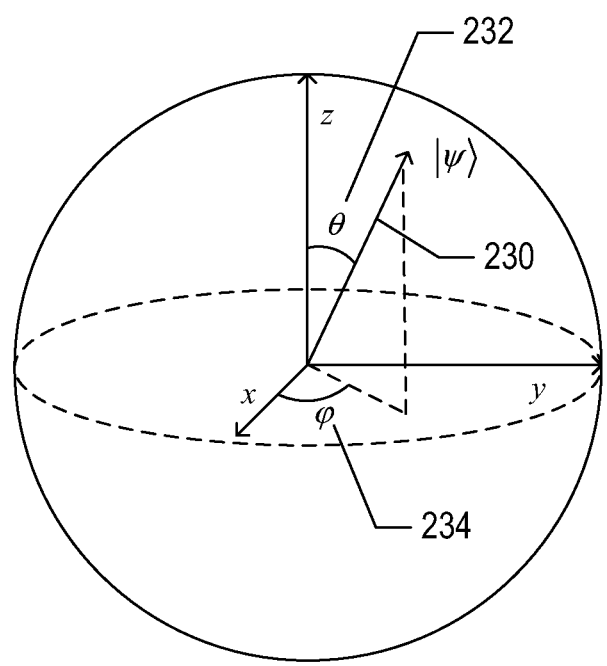

FIG. 2D shows a complete representation of the Bloch sphere for an arbitrary state vector $|\psi\rangle$. The state vector $|\psi\rangle$ 230 can be specified with two angles $\theta$ 232 and $\phi$ 234. Using the polar form for the complex coefficients $\alpha$ and $\beta$, state vector $|\psi\rangle$ can be expressed as:

$$|\psi\rangle = r_\alpha e^{i\phi_\alpha}|0\rangle + r_\beta e^{i\phi_\beta}|1\rangle$$

As previously discussed, the squares of the magnitudes of the coefficients $\alpha$ and $\beta$ correspond to the probabilities that a measurement of a qubit in state $|\psi\rangle$ will return state vectors $|0\rangle$, $|1\rangle$, respectively. The state vector $|\psi\rangle$ can be multiplied by an arbitrary complex number with unit modulus, $e^{i\alpha}$, without changing the magnitudes of the squares of the coefficients $\alpha$ and $\beta$, as shown by:

$$e^{i\gamma}|\psi\rangle = e^{i\gamma}r_\alpha e^{i\phi_\alpha}|0\rangle + e^{i\gamma}r_\beta e^{i\phi_\beta}|1\rangle,$$

$$|e^{i\gamma}r_\alpha e^{i\phi_\alpha}|^2 = e^{i\gamma}r_\alpha e^{i\phi_\alpha}e^{-i\gamma}r_\alpha e^{-i\phi_\alpha} = r_\alpha^2 = |\alpha|^2,$$

$$|e^{i\gamma}r_\beta e^{i\phi_\beta}|^2 = |\beta|^2.$$

Thus, there is a global phase-shift degree of freedom in the expression of a state vector that does not affect the measureable properties associated with the state.

The state vector $|\psi\rangle$ can alternately be expressed, using the Bloch-sphere angles shown in FIG. 2D, as:

$$|\psi\rangle = \cos\frac{\theta}{2}|0\rangle + e^{i\varphi}\sin\frac{\theta}{2}|1\rangle.$$

A derivation of this expression from the previously presented expression $|\psi\rangle = r_\alpha e^{i\phi_\alpha}|\ \rangle + r_\beta e^{i\phi_\beta}|1\rangle$ for the state vector $|\psi\rangle$ follows:

$$e^{-i\varphi_\alpha}|\psi\rangle = e^{-i\varphi_\alpha} r_\alpha e^{i\varphi_\alpha}|0\rangle + e^{i\varphi_\alpha} r_\beta e^{i\varphi_\beta}|1\rangle,$$

$$= r_\alpha|0\rangle + r_\beta e^{i(\varphi_\beta - \varphi_\alpha)}|1\rangle - r_\alpha|0\rangle + r_\beta e^{i\varphi}|1\rangle,$$

$$|\psi\rangle = r_\alpha|0\rangle + r_\beta e^{i\varphi}|1\rangle,$$

$$x = r\sin\theta\cos\varphi,$$

$$y = r\sin\theta\sin\varphi,$$

$$z = r\cos\theta,$$

$$r = 1, \; r_\alpha \to z,$$

$$|\psi\rangle = \cos\theta|0\rangle + e^{i\varphi}\sin\theta|1\rangle,$$

$$\theta' = 2\theta,$$

$$|\psi\rangle = \cos\left(\frac{\theta'}{2}\right)|0\rangle + e^{i\varphi}\sin\left(\frac{\theta'}{2}\right)|1\rangle..$$

The derivation uses a global phase factor to remove a phase coefficient from one of the terms and then employs spherical coordinate representations of the orthonormal axes x, y, and z as well as several substitutions to produce the final expression.

In the current discussion, a qubit is treated as a mathematical object with the above-described properties. However, these mathematically-described qubits correspond to actual physical hardware qubits that can be implemented using a number of different physical implementations, including trapped ions, optical cavities, and individual elementary particles, molecules, or aggregations of molecules that exhibit qubit behavior.

Various different primitive operations, corresponding to logic circuits in a digital computer and to computer instructions that control operation of logic circuits, can be performed on classical bits to produce classical bits with possibly altered state values. These primitive operations are referred to as "gates." For example, when a signal corresponding to the state of a first bit is passed through a NOT gate and stored in a second classical bit, the state of the second classical bit is opposite from the state of the first classical bit. In fact, the NOT gate is the only fundamental, non-trivial, traditional, classical computing gate with a single-bit input and a single-bit output. By contrast, there are an infinite number of possible single-qubit quantum gates that change the state vector of a qubit. As can be seen in FIG. 2D, changing the state of a qubit essentially involves changing the direction of the state vector or, in other words, selecting a new direction for the state vector from among an infinite number of directions. Changing the state of a qubit state vector is therefore referred to as a "rotation." A rotation, state change, or single-qubit quantum-gate operation is represented mathematically by a unitary 2×2 matrix with complex elements:

$$\begin{bmatrix} a & b \\ -b^* & a^* \end{bmatrix}$$

where $\alpha, \beta \in C$ and the notation "x*" indicates the complex conjugate of x. A unitary 2×2 matrix X with complex elements can be defined as a 2×2 matrix X with the following property:

$$X^\dagger X = XX^\dagger = I = \begin{bmatrix} 1 & 0 \\ 0 & 1 \end{bmatrix}$$

where $X^\dagger = \begin{bmatrix} a^* & -b \\ b^* & a \end{bmatrix}$.

The adjoint $X^\dagger$ of a unitary matrix X is the complex-conjugate transpose of the unitary X. The fact that multiplication of the adjoint unitary operation by the unitary operation, or vice versa, produces the identity operator Id, or identity matrix I, can be seen by:

$$\begin{bmatrix} a^* & -b \\ b^* & a \end{bmatrix}\begin{bmatrix} a & b \\ -b^* & a^* \end{bmatrix} = \begin{bmatrix} a^*a + bb^* & a^*b - ba^* \\ ab^* - ab^* & bb^* + aa^* \end{bmatrix} = \begin{bmatrix} 1 & 0 \\ 0 & 1 \end{bmatrix}$$

since $$a^*a + bb^* = |a|^2 + |b|^2 = 1.$$

Thus, the operation of a quantum gate on a qubit with state $|\psi\rangle$, where $|\psi\rangle$ is expressed in vector form as $$|\psi\rangle = \begin{bmatrix} \alpha \\ \beta \end{bmatrix},$$

can be expressed as left-hand multiplication of the state vector by the unitary matrix corresponding to the unitary operation:

$$\begin{bmatrix} a & b \\ -b^* & a^* \end{bmatrix}\begin{bmatrix} \alpha \\ \beta \end{bmatrix} = \begin{bmatrix} a\alpha + b\beta \\ -b^*\alpha + a^*\beta \end{bmatrix} = \begin{bmatrix} \alpha' \\ \beta' \end{bmatrix}.$$

In the current discussion, all of the quantum gates and quantum circuits are single-qubit quantum gates and quantum circuits, and therefore are assumed to have 2×2 complex matrix representations.

Figure 3:
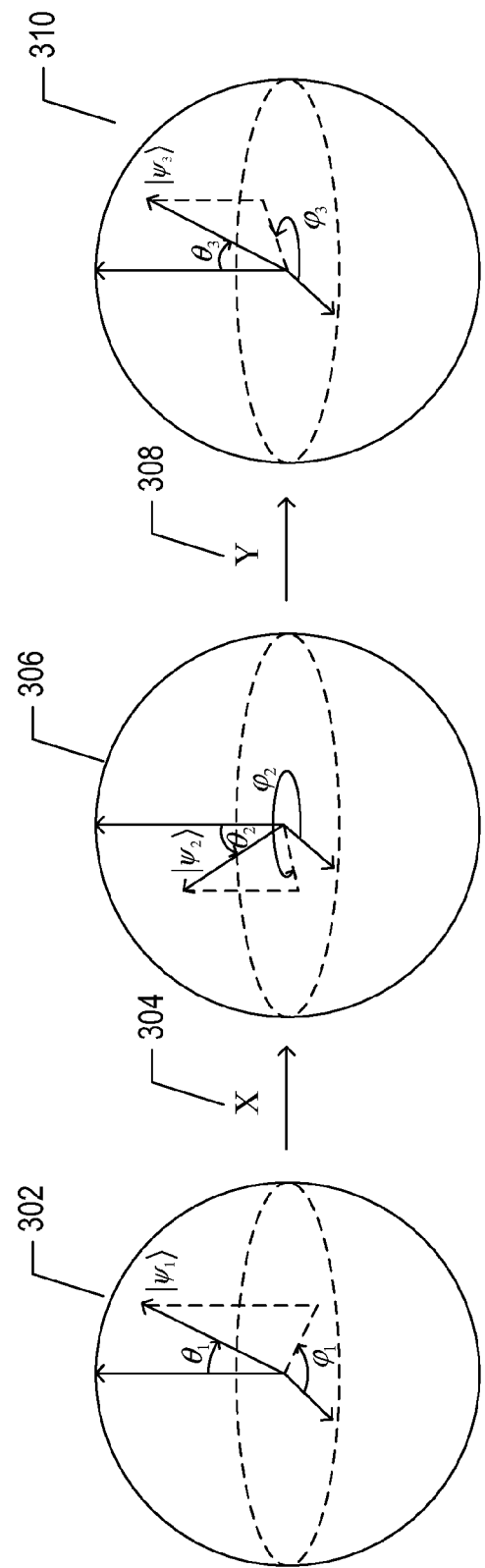
FIG. 3 illustrates a quantum circuit comprising two quantum gates.

FIG. 3 illustrates a quantum circuit comprising two quantum gates. In FIG. 2, a qubit in a first state $|\psi_1\rangle$, represented by the Bloch sphere 302, is transformed by unitary operation X 304 to a qubit in state $|\psi_2\rangle$, as represented by Bloch sphere 306, which is, in turn, transformed by unitary operation Y 308 to place the qubit in state $|\psi_3\rangle$, as represented by Bloch sphere 310. This quantum circuit can be represented as the gate sequence XY which transforms the qubit as follows:

$$\overset{X}{\begin{bmatrix} X_{11} & X_{12} \\ X_{21} & X_{22} \end{bmatrix}}\overset{|\psi_1\rangle}{\begin{bmatrix} \alpha_1 \\ \beta_1 \end{bmatrix}} \to \begin{bmatrix} X_{11}\alpha_1 + X_{12}\beta_1 \\ X_{21}\alpha_1 + X_{22}\beta_1 \end{bmatrix} \overset{=\;|\psi_2\rangle}{= \begin{bmatrix} \alpha_2 \\ \beta_2 \end{bmatrix}}$$

$$\overset{Y}{\begin{bmatrix} Y_{11} & Y_{12} \\ Y_{21} & Y_{22} \end{bmatrix}}\overset{|\psi_2\rangle}{\begin{bmatrix} \alpha_2 \\ \beta_2 \end{bmatrix}} \to \begin{bmatrix} Y_{11}\alpha_1 + Y_{12}\beta_1 \\ Y_{21}\alpha_1 + Y_{22}\beta_1 \end{bmatrix} =$$

$$\begin{bmatrix} Y_{11}(X_{11}\alpha_1 + X_{12}\beta_1) + Y_{12}(X_{21}\alpha_1 + X_{22}\beta_1) \\ Y_{21}(X_{11}\alpha_1 + X_{12}\beta_1) + Y_{22}(X_{21}\alpha_1 + X_{22}\beta_1) \end{bmatrix} \overset{=\;|\psi_3\rangle}{= \begin{bmatrix} \alpha_3 \\ \beta_3 \end{bmatrix}}.$$

Alternatively, one can multiply the two matrices representing operations X and Y together to produce matrix Z, and then left-hand multiply state vector $|\psi_1\rangle$ by Z to produce the same result:

$$\begin{bmatrix} X_{11} & X_{12} \\ X_{21} & X_{22} \end{bmatrix} \begin{bmatrix} Y_{11} & Y_{12} \\ Y_{21} & Y_{22} \end{bmatrix} = \begin{bmatrix} X_{11}Y_{11}+X_{12}Y_{21} & X_{11}Y_{12}+X_{12}Y_{22} \\ X_{21}Y_{11}+X_{22}Y_{21} & X_{21}Y_{12}+X_{22}Y_{22} \end{bmatrix}$$

$$\begin{bmatrix} X_{11}Y_{11}+X_{12}Y_{21} & X_{11}Y_{12}+X_{12}Y_{22} \\ X_{21}Y_{11}+X_{22}Y_{21} & X_{21}Y_{12}+X_{22}Y_{22} \end{bmatrix} \begin{bmatrix} \alpha_1 \\ \beta_1 \end{bmatrix} =$$

$$\begin{bmatrix} \alpha_1(X_{11}Y_{11}+X_{12}Y_{21})+\beta_1(X_{11}Y_{12}+X_{12}Y_{22}) \\ \alpha_1(X_{21}Y_{11}+X_{22}Y_{21})+\beta_1(X_{21}Y_{12}+X_{22}Y_{22}) \end{bmatrix} = \begin{bmatrix} \alpha_3 \\ \beta_3 \end{bmatrix}.$$

A quantum circuit can therefore be specified as a sequence of quantum gates in which the quantum gates are symbolically represented or, equivalently, numerically represented. There are several ways to look at a quantum circuit. One can, as discussed above, multiply the matrices corresponding to the component quantum gates together in the order specified by the symbol sequence to produce a final, resultant, 2×2 complex matrix that represents the same state change, in a single operation or quantum gate, corresponding to the state change produced by sequential application of the quantum gates specified in the original symbol sequence. A quantum circuit can be viewed as a design for an actual hardware circuit in a quantum computer, where the hardware circuit needs to perform the operation specified by the single-gate representation of the quantum circuit, or can be viewed as a quantum-computing program, in which operations corresponding to the sequence of quantum gates represented by the symbol sequence are applied to a qubit in order to produce a final qubit state.

The term "quantum circuit" is thus somewhat interchangeable with the term "quantum gate," as a quantum circuit can be expressed as a resultant operator. However, symbolically represented quantum circuits are useful in quantum circuit design for many reasons, including the fact that it is quite difficult to design and implement arbitrary physical quantum gates, but far easier to design and implement certain standard quantum gates, several of which are shown below. A symbolic representation using implementable quantum gates can thus represent a feasible design for hardware or a control program that produces the result that would be produced by the quantum-gate resultant obtained by multiplying the sequence of standard quantum gates. In addition, quantum circuits symbolically represented as sequences of standard gates do not necessarily map with uniform density to the set of arbitrary quantum gates, and finding a standard-gate implementation working back from a desired quantum gate is generally not a computationally tractable problem.

Normalization and Canonical-Form Quantum Circuits

The current application is directed to methods and systems for representing quantum circuits using the three fundamental quantum gates, H, T, and S:

$$H = \begin{bmatrix} \frac{i}{\sqrt{2}} & \frac{i}{\sqrt{2}} \\ \frac{i}{\sqrt{2}} & -\frac{i}{\sqrt{2}} \end{bmatrix}$$

$$T = \begin{bmatrix} e^{-i\frac{\pi}{8}} & 0 \\ 0 & e^{i\frac{\pi}{8}} \end{bmatrix}$$

$$S = \begin{bmatrix} e^{-i\frac{\pi}{4}} & 0 \\ 0 & e^{i\frac{\pi}{4}} \end{bmatrix} = TT.$$

Multiplying quantum gate H by itself generates the identity matrix I or, equivalently, the Id operation:

$$HH = \begin{bmatrix} \frac{i}{\sqrt{2}} & \frac{i}{\sqrt{2}} \\ \frac{i}{\sqrt{2}} & -\frac{i}{\sqrt{2}} \end{bmatrix} \begin{bmatrix} \frac{i}{\sqrt{2}} & \frac{i}{\sqrt{2}} \\ \frac{i}{\sqrt{2}} & -\frac{i}{\sqrt{2}} \end{bmatrix} = \begin{bmatrix} -1 & 0 \\ 0 & -1 \end{bmatrix} = e^{i\pi} \begin{bmatrix} 1 & 0 \\ 0 & 1 \end{bmatrix} = \begin{bmatrix} 1 & 0 \\ 0 & 1 \end{bmatrix} = I$$

where a global phase-shift multiplier is disregarded, as discussed above. The number of times that a quantum gate or operator is multiplied by itself to generate the identity operation Id is the algebraic order of the quantum gate. Thus, the algebraic order of quantum gate H is 2. The algebraic order of the quantum gate T is 8:

$$TTTTTTTT = \begin{bmatrix} 1 & 0 \\ 0 & 1 \end{bmatrix}$$

Two additional quantum gates employed in currently disclosed methods and systems include SH and TH, each binary compositions of two of the above-mentioned quantum gates H, T, and S:

$$SH = \begin{bmatrix} e^{-i\frac{\pi}{4}} & 0 \\ 0 & e^{i\frac{\pi}{4}} \end{bmatrix} \begin{bmatrix} \frac{i}{\sqrt{2}} & \frac{i}{\sqrt{2}} \\ \frac{i}{\sqrt{2}} & -\frac{i}{\sqrt{2}} \end{bmatrix} = \begin{bmatrix} \frac{e^{i\frac{\pi}{4}}}{\sqrt{2}} & \frac{e^{i\frac{\pi}{4}}}{\sqrt{2}} \\ \frac{ie^{i\frac{\pi}{4}}}{\sqrt{2}} & \frac{-ie^{-i\frac{\pi}{4}}}{\sqrt{2}} \end{bmatrix} = \begin{bmatrix} \frac{i+1}{2} & \frac{i+1}{2} \\ \frac{i-1}{2} & \frac{-i+1}{2} \end{bmatrix}$$

$$TH = \begin{bmatrix} e^{-i\frac{\pi}{8}} & 0 \\ 0 & e^{i\frac{\pi}{8}} \end{bmatrix} \begin{bmatrix} \frac{i}{\sqrt{2}} & \frac{i}{\sqrt{2}} \\ \frac{i}{\sqrt{2}} & -\frac{i}{\sqrt{2}} \end{bmatrix} = \begin{bmatrix} \frac{e^{i\frac{5\pi}{8}}}{\sqrt{2}} & \frac{e^{i\frac{5\pi}{8}}}{\sqrt{2}} \\ \frac{e^{i\frac{3\pi}{8}}}{\sqrt{2}} & \frac{-e^{i\frac{3\pi}{8}}}{\sqrt{2}} \end{bmatrix}.$$

The algebraic order of the quantum gate TH is infinite, while the algebraic order of the quantum gate SH is 3, as shown by:

$$SHSH = \begin{bmatrix} \frac{i+1}{2} & \frac{i+1}{2} \\ \frac{i-1}{2} & \frac{-i+1}{2} \end{bmatrix} \begin{bmatrix} \frac{i+1}{2} & \frac{i+1}{2} \\ \frac{i-1}{2} & \frac{-i+1}{2} \end{bmatrix} = \begin{bmatrix} \frac{i-1}{2} & \frac{i+1}{2} \\ \frac{i-1}{2} & \frac{-i-1}{2} \end{bmatrix}$$

$$SHSHSH =$$

$$\begin{bmatrix} \frac{i-1}{2} & \frac{i+1}{2} \\ \frac{i-1}{2} & \frac{-i-1}{2} \end{bmatrix} \begin{bmatrix} \frac{i+1}{2} & \frac{i+1}{2} \\ \frac{i-1}{2} & \frac{-i+1}{2} \end{bmatrix} = \begin{bmatrix} -1 & 0 \\ 0 & -1 \end{bmatrix} \xrightarrow{phase\ change} \begin{bmatrix} 1 & 0 \\ 0 & 1 \end{bmatrix}.$$

All of the possible 2×2 unitary matrices corresponding to rotations of state vectors in dual inner-product spaces defined by two orthonormal basis vectors form an infinite group referred to as U(2). The group is infinite because the 2×2 unitary matrices are defined in terms of two complex numbers, of which there are an infinite number of pairs that meet the above-discussed constraints for rotation matrices. Consider the phase-rotation matrices with general form:

$$\begin{bmatrix} e^{i\theta} & 0 \\ 0 & e^{i\theta} \end{bmatrix} = e^{i\theta}\begin{bmatrix} 1 & 0 \\ 0 & 1 \end{bmatrix}$$

where θ is an arbitrary real angle. When one of these matrices, or operations, multiplies any element of U(2), the resultant operator applied to an initial state vector produces a transformed state vector with the same squared absolute values of the state-vector components α and β as those for a transformed state vector produced by applying the original element of U(2) operator to the initial state vector, as can be seen from:

$$\begin{bmatrix} a & b \\ -b^* & a^* \end{bmatrix}\begin{bmatrix} \alpha \\ \beta \end{bmatrix} = \begin{bmatrix} a\alpha + b\beta \\ -b^*\alpha + a^*\beta \end{bmatrix} = \begin{bmatrix} \alpha' \\ \beta' \end{bmatrix}$$

$$\begin{bmatrix} e^{i\theta} & 0 \\ 0 & e^{i\theta} \end{bmatrix}\begin{bmatrix} a & b \\ -b^* & a^* \end{bmatrix}$$

$$\begin{bmatrix} \alpha \\ \beta \end{bmatrix} = \begin{bmatrix} e^{i\theta}a & e^{i\theta}b \\ -e^{i\theta}b^* & e^{i\theta}a^* \end{bmatrix}\begin{bmatrix} \alpha \\ \beta \end{bmatrix} = \begin{bmatrix} e^{i\theta}(a\alpha+b\beta) \\ -e^{i\theta}(-b^*\alpha+a^*\beta) \end{bmatrix} = \begin{bmatrix} \alpha'' \\ \beta'' \end{bmatrix}$$

$$|\alpha''|^2 = e^{i\theta}e^{-i\theta}|\alpha'|^2 = |\alpha'|^2$$
$$|\beta''|^2 = e^{i\theta}e^{-i\theta}|\beta'|^2 = |\beta'|^2$$

Thus, the global phase-rotation matrices do not affect the observable values associated with qubit state vectors. There are an infinite number of global phase-rotation matrices, or operators, that are members of U(2). These global phase-rotation matrices, or operators, form an infinite subgroup of U(2) that is referred to as GPh:

$$GPh = \left[\begin{bmatrix} e^{i\alpha} & 0 \\ 0 & e^{i\alpha} \end{bmatrix}, \begin{bmatrix} e^{i\beta} & 0 \\ 0 & e^{i\beta} \end{bmatrix}, \begin{bmatrix} e^{i\gamma} & 0 \\ 0 & e^{i\gamma} \end{bmatrix}, \dots\right]$$

where $\alpha, \beta, \gamma, \dots \in R$

The infinite group U(2) can be factored by the subgroup GPh to generate the infinite group PSU(2), where PSU(2) is U(2) modulo GPh:

$$U(2) = [\dots e^{i\varphi_a}X_j \dots e^{i\varphi_b}X_j \dots e^{i\varphi_c}X_j$$
$$\dots e^{i\varphi_a}X_k \dots e^{i\varphi_b}X_k \ e^{i\varphi_c}X_k \dots e^{i\varphi_a}X_l \dots e^{i\varphi_b}X_l \dots]$$
$$\frac{U(2)}{GPh} = [\dots X_j \dots X_k \dots X_l] = PSU(2)$$

The trace of a matrix is the sum of the diagonal elements of the matrix. The traces of all members of U(2) that map to a particular member of PSU(2) by the modulo operation with respect to GPh are identical:

$$tr\left(\begin{bmatrix} e^{i\varphi} & 0 \\ 0 & e^{i\varphi} \end{bmatrix}\begin{bmatrix} a & b \\ -b^* & a^* \end{bmatrix}\right) = e^{i\varphi}tr\left(\begin{bmatrix} a & b \\ -b^* & a^* \end{bmatrix}\right) = tr\left(\begin{bmatrix} a & b \\ -b^* & a^* \end{bmatrix}\right)$$

since $|e^{i\varphi}| = 1$.

It is well known that the group of symbolic representations of quantum circuits generated by the quantum-gate basis <H,T>, where H and T are two of the quantum-gate operators discussed above, is everywhere dense in PSU(2). The infinite group of symbolic representations of quantum circuits generated by the basis <H,T> is:

$$\langle H, T \rangle \rightarrow \begin{bmatrix} T, TT, TH, TTT, TTH, THT, THH, \dots, \\ H, HT, HH, HTT, HTH, HHT, HHH, \dots \end{bmatrix}$$
$$= U_{\langle H,T \rangle}.$$

Figure 4A:
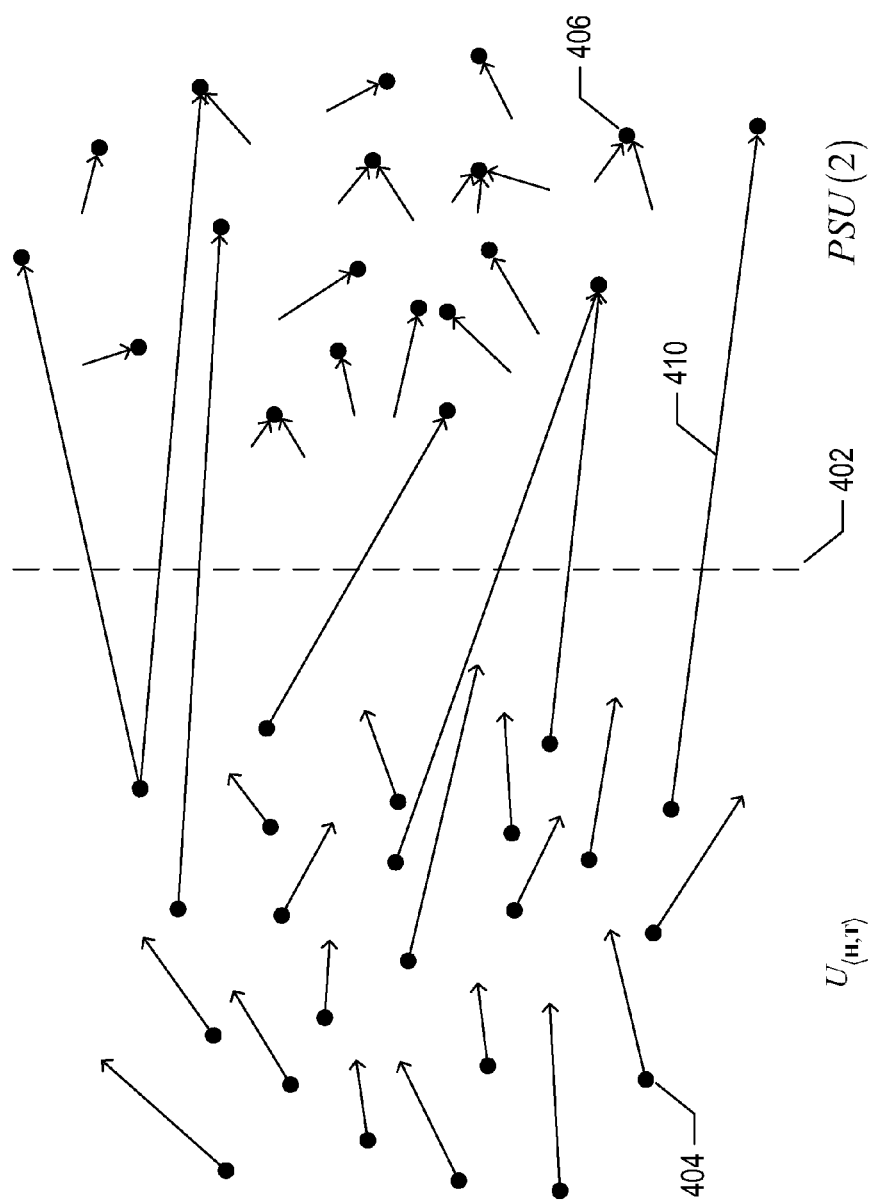
FIGS. 4A-B illustrate what it means for $U_{<H,T>}$ to be everywhere dense in PSU(2).
Figure 4B:
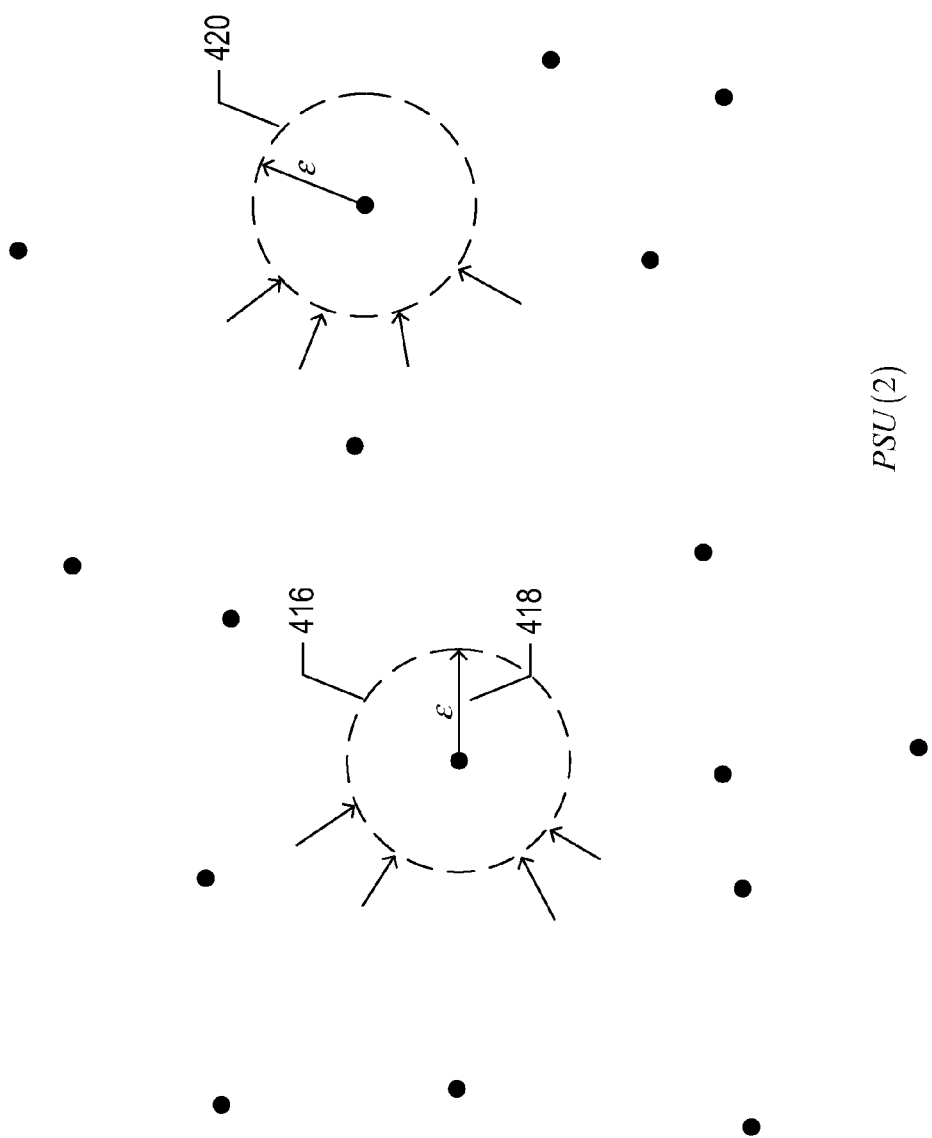

FIGS. 4A-B illustrate what it means for $U_{<H,T>}$ to be everywhere dense in PSU(2). In FIG. 4A, a vertical dashed line 402 separates points representing elements of $U_{<H,T>}$, such as point 404, on the left side of the dashed line 402, from points representing elements of PSU(2), such as point 406, on the right side of the dashed vertical line 402. Because both PSU(2) and $U_{<H,T>}$ are infinite groups, only a small number of representative points are shown for both groups, in FIGS. 4A-B. Consider a mapping of elements from $U_{<H,T>}$ to equivalent elements of PSU(2), represented by arrows, such as arrow 410, in FIG. 4A. Because both $U_{<H,T>}$ and PSU(2) are infinite groups, a mapping cannot be enumerated. However, it can be shown, as illustrated in FIG. 4B, that if one selects a neighborhood in PSU(2) around any element in PSU(2), such as the neighborhood 416 represented by the dashed circle in FIG. 4B defined by the radius E 418, and selects a similarly sized neighborhood 420 about another element in PSU(2), an equal number of elements in $U_{<H,T>}$ map to elements within the two neighborhoods 416 and 420. This, in turn, implies that, for any unitary circuit u in PSU(2) and for any distance-metric value ϵ>0, there exists a circuit u' in $U_{<H,T>}$ such that the distance between u' and u is less than ϵ. In other words, any quantum circuit in PSU(2) can be approximated as closely as desired by a corresponding quantum circuit generated only from H and T quantum gates. The quantum circuits in $U_{<H,T>}$ can be expressed and represented as sequences of H and T symbols. Various different distance metrics for the distance between quantum circuits u' and u can be used, such as the metric:

$$\text{dist}(u',u) = \sqrt{(2-|tr(u' \cdot u^\dagger)|)/2}$$

where $u^\dagger$ is the adjoint, or complex-conjugate transpose, of u.

It is generally a difficult problem to implement an arbitrary quantum circuit u selected from PSU(2). However, the fact that an arbitrary quantum gate u can be approximated, to any desired level of approximation, by a quantum circuit u' selected from $U_{<H,T>}$ provides a direction for automating the determination of practically implementable and efficient quantum circuits. For example, the members of $U_{<H,T>}$ that can be represented by symbol strings of up to some maximum length can be compiled into a database, and the quantum-circuit design problem can be transformed into a problem of searching the database for a minimum-cost circuit u'∈$U_{<H,T>}$ that differs from the desired quantum circuit u∈PSU(2) by less than a threshold distance ϵ. In certain cases, of course, u'∈$U_{<H,T>}$ can be found that is exactly equivalent to a particular u∈PSU(2). In other cases, because of the finite-length constraint, only an approximate u' can be found. In other words, the searching process can be represented by a function that takes, as parameters, an arbitrary quantum circuit u in PSU(2) and a threshold distance $\epsilon$ and returns a set $S_{u \to u'}$ of quantum circuits in $U_{<H,T>}$ that differ from u by less than $\epsilon$:

$$S_{u \to u'} = f(u, \epsilon) \text{ where } u' \in U_{(H,T)} \text{ and } u \in \text{PSU}(2).$$

Selecting the minimum-cost approximating circuit u' from $U_{<H,T>}$ can then be cast as an optimization problem:

$$S_{opt} = \underset{u' = f(u, \epsilon)}{\text{argmin}} \, g(u').$$

where g(u') is a cost function. There are numerous different cost functions that can be used to define the quantum-circuit-design method, including the length, in symbols, of a symbolic representation of the quantum circuit or the number of T gates or T symbols in the symbolic representation of the quantum circuit:

$$g(u') = \text{length}(u'), \text{ or}$$

$$g(u') = \text{number} T \text{gates}(u').$$

There are, however, certain difficulties associated with the above-proposed quantum-circuit design method. One difficulty is that multiple quantum circuits with multiple different symbolic representations of different lengths may represent the same, underlying, simplified quantum circuit. For example, a subsequence of symbols within a symbolic representation of a quantum circuit may represent a sequence of quantum-gate multiplications that result in the identity operation Id or identity matrix I, and thus can be removed from the symbol string without changing the result of applying all the operations in the symbol string to a qubit or, in other words, multiplying all of the quantum gates represented by the symbols in the symbol string together to generate the resultant quantum gate. Therefore, the fact that symbolic representations of different lengths may practically reduce to the same resultant quantum circuit may complicate the above-mentioned search-based approach to quantum-circuit design. A second problem associated with search-based quantum-circuit-design methods is that of partitioning the search problem into independent subtasks that can be efficiently carried out in distributed fashion.

The current application discloses methods and systems of alternative representations of quantum circuits with provable algebraic properties that facilitate implementation of search-based quantum-circuit-design methods and systems. First, a new basis, the <TH,SH> basis, is employed for symbolic quantum-circuit representations:

$$\langle TH, SH \rangle \to \begin{bmatrix} TH, THTH, THSH, THTHTH, THTHSH, THSHTH, \ldots, \\ SH, SHTH, SHSH, SHTHTH, SHTHSH, SHTHSH, \ldots \end{bmatrix}$$
$$= U_{\langle TH, SH \rangle}.$$

The TH and SH gates are discussed above. The S gate is far cheaper to implement, in many quantum-computing architectures, than the T gate. Because both the H and T gates can be expressed in the <TH,SH> basis $$H = THSHSHTH,$$

$$T = THTHSHSHTH,$$

$U_{<H,T>}$ maps to $U_{<TH,SH>}$ and vice versa:

$$u' \in U_{(H,T)} \leftrightarrow u'' \in U_{(TH,SH)}.$$

Because, as discussed above:

$$SH^3 = \text{Id},$$

an arbitrary non-null symbolic circuit in the <TH,SH> basis can be rewritten to include no more than two adjacent SH gates:

$$u'' \to u''' = \text{a composition of one or more subcircuits}$$
$$u_s \in \{SH^l\} \text{ and } u_t \in \{TH^k\}$$

where $l \in \{1, 2\}$, $k \in \{1, 2, \ldots\}$, and the $u_s$ and $u_t$ subcircuits are strictly alternating.

Next, normalized and canonical symbolic forms are described. A normalized-form representation of a quantum circuit in the <TH,SH> basis is either a null string or, in other words, the identity element Id, or a quantum circuit expressed as a sequence of TH and SH gates that contains no adjacent SH gates and that ends in TH:

$$u'' \in \{\emptyset, u'''' \circ TH\}$$

where u''''=a composition of zero or more subcircuits $u_s \in \{SH^l\}$ and $u_t \in \{TH^k\}$, $l \in \{1\}$, $k \in \{1, 2, \ldots\}$, the $u_s$ and $u_t$ subcircuits are strictly alternating, and "∘" is a symbolic-circuit-representation concatenation operator.

A symbolic representation of a quantum circuit in the <TH, SH> basis, $u^{cc}$, is in canonical form when the quantum-circuit representation is in normalized form and an SH gate does not occur before the fifth gate of the representation. Thus:

$$u^{cc} = u^h \circ u^n$$

$$\text{where } u^h \in \left\{ \begin{array}{l} \emptyset, TH, THTH, THTHTH, THTHTHTH, \\ THTHTHTHTH, THTHTHTHSHTH \end{array} \right\}.$$

Thus, the shortest canonical quantum-circuit symbolic representation that contains the SH gate is the circuit:

THTHTHTHSHTH.

The set N is, in the following discussion, the set of all normalized-form representations in the <TH,SH> basis and the set CC is the set of all canonical-form representations in the <TH,SH> basis:

N is the set of all u''

CC is the set of all $u^{cc}$.

Sets N and CC are both subsets of $U_{<H,T>}$. A quantum-circuit symbolic representation composed of two or more normalized-form representations is also a normalized-form representation and a symbolic quantum-circuit representation composed of two or more canonical-form representations is also a canonical-form representation:

$N \subset U_{(H,T)}$ $CC \subset U_{(H,T)}$ $u^{n'}$ composed of one or more $u'' \in N$.

$u^{cc'}$ composed of one or more $u^{cc} \in CC$.

When a canonical-form quantum-circuit symbolic representation has a length, in SH and TH gates, greater than 3, then a quantum-circuit symbolic representation obtained by appending the canonical-form quantum-circuit symbolic representation with a normalized-form quantum-circuit symbolic representation is canonical:

$\forall u^{cc}$:length_in_SH_and_TH_gates($u^{cc}$)> 3, $u^{cc} \circ u'' \in CC$.

Figure 5B:
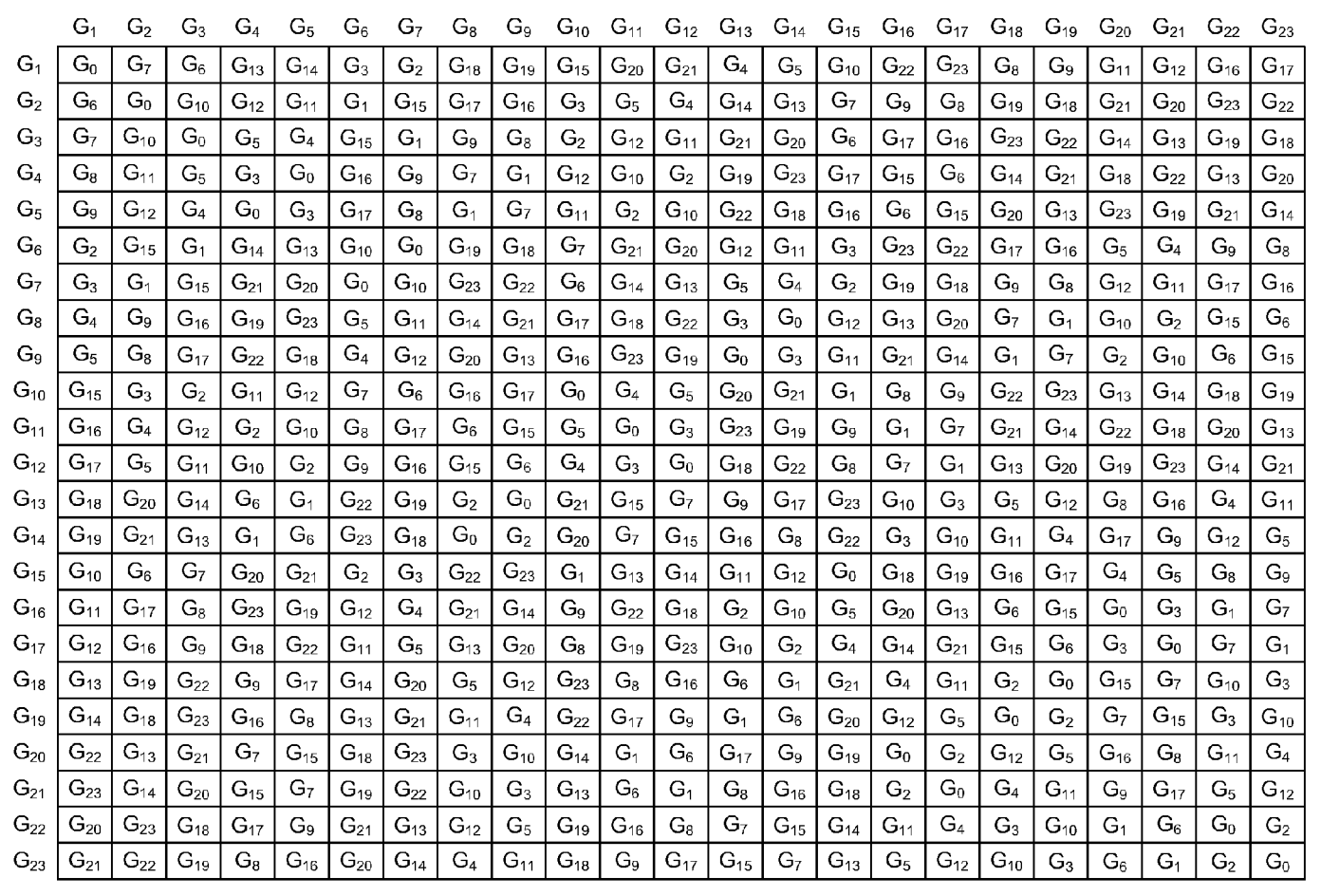

There is a relatively small subgroup, referred to as CPH and generated by the <H,S> basis, which is a subset of $U_{<H,T>}$. This subgroup has only 24 elements. FIGS. 5A-C illustrate the group CPH. FIG. 5A shows, in tabular form, the elements of the group CPH using the notation $G_x$, where x is an integer in $\{0, 1, \ldots, 23\}$, paired with symbolic representations in the <H,S> basis. FIG. 5B provides a group-multiplication table for the group CPH, and FIG. 5C provides a set of commutation rules for commuting an element of the group CPH with the gate T. Group multiplication of any two elements $G_x$ and $G_y$ of the group CPH generates an element of CPH according to the multiplication rules shown in FIG. 5B. As shown in FIG. 5C, an equivalent symbolic representation of $G_x T$, where $G_x$ is a symbolically represented element of CPH, can be rewritten as one of $TG_y$, $HTG_y$, or $HSHTG_y$.

Symbolic representations of elements of the group CPH, shown in FIG. 5A, can be composed with a normalized-form representation of a quantum circuit in the <TH,SH> basis to generate any element in $U_{<H,T>}$, and symbolic representations of elements of the group CPH can be combined with a canonical-form symbolic representation in the <TH,SH> basis to generate any element of $U_{<H,T>}$. An arbitrary circuit u' in the <H,T> basis can be mapped to a composition of a normalized-form symbolic representation and one or two symbolic representations of elements of CPH:

$$u' \in U_{(H,T)} \to u''g \text{ and/or } Hu''g$$

where $g \in CPH$, $u'' \in N$. Such compositions are referred to as "normal representations." This implies that the cardinality of $U_{<H,T>}$ is at most 48 times greater than the cardinality of the set of normalized-form symbolic representations:

$$U_{(H,T)} |<=|H \text{ or no } H||N||CPH|<=2 \cdot |N| \cdot 24 \leq 48|N|.$$

Similarly, an arbitrary circuit u' in the <H,T> basis can be alternatively symbolically represented as a composition of two symbolic representations of CPH-group members and a canonical-form symbolic representation:

$$u' \in U_{(H,T)} \to g_1 u^{cc} g_2$$

where $g_1, g_2 \in CPH, u^{cc} \in CC$.
This implies that the cardinality of $U_{<H,T>}$ is no greater than 576 times the cardinality of CC:

$$| U_{(H,T)} |<=|CPH||CC||CPH| \leq 24 \cdot |CC| \cdot 24 \leq 576|CC|.$$

Because any circuit in $U_{<H,T>}$ can be represented both as a normal representation and as a canonical-form representation, a given normal representation can be converted to an equivalent canonical representation with an identical number of TH gates and a given canonical representation can be converted to an equivalent normal representation with an identical number of TH gates.

These properties suggest that the canonical-form quantum-circuit representations can be used as the basis for a database of symbolic representations equivalent to symbolic representations in the <H,T> basis and that conversion of symbolic circuit representations to normal representations can be used to obtain the minimum-cost quantum-circuit designs for arbitrary quantum circuits in PSU(2). Thus, an automated method for mapping circuit representations in the <H,T> basis to equivalent normal representations provides a basis for efficient database-search-based quantum-circuit-design methods and systems.

Quantum-Circuit Design Method and System

FIG. 6 illustrates, at a high level, the quantum-circuit design method and system to which the current application is directed. A 2×2 matrix representation of a particular quantum circuit u, in general an element of PSU(2), 602 is provided as a design goal or target circuit. The design process 604 produces a design for u comprising a symbolic representation of a circuit in $U_{(H,T)}$, $U_{(TH,SH)}$, or another standard-gate basis 606. The symbolic representation of a quantum circuit, or design, 606 produced by the design method and system may be an exact implementation of u, when u can be exactly implemented in the desired basis, but is more generally an approximation of u such that the distance between the design circuit and u is less than a distance-metric value $\epsilon$. Of course, any of many methods for digitally representing both u and the symbolic representation of the quantum-circuit design 606 may be used. For example, u may be input as a pair of complex numbers a and b using any of various digital representations of complex numbers and the individual gates T, H, and S in the symbolic representation 606 can be digitally represented as bytes of 16-bit Unicode words corresponding to characters "T," "H," and "S," as numeric values contained in bit fields within an array or list of one or more words, such as 32-bit words, 64-bit words, or 128-bit words, or by other methods.

Figure 7:
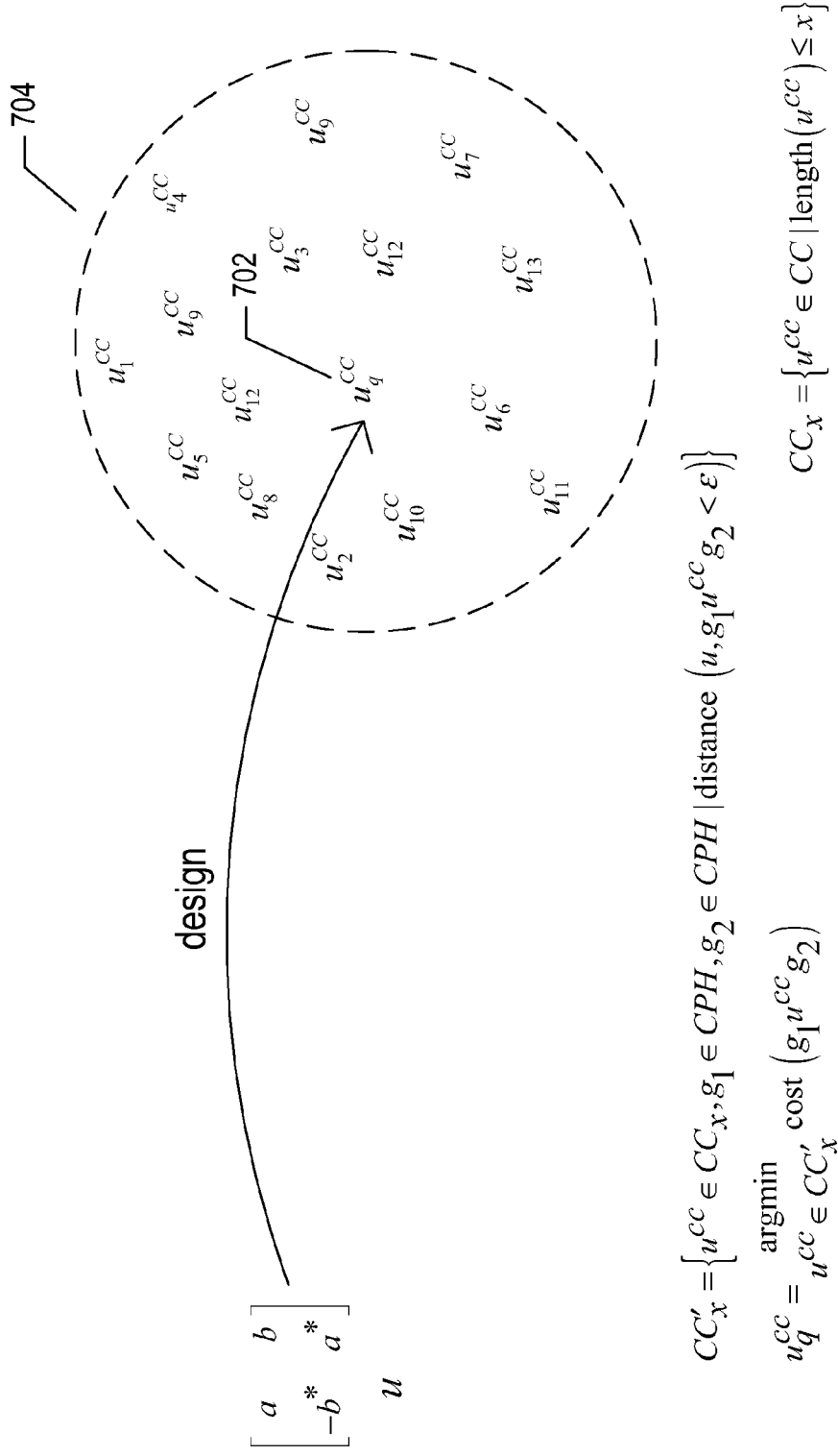
FIG. 7 provides greater detail with respect to the quantum-circuit-design method and system illustrated in FIG. 6.

FIG. 7 provides greater detail with respect to the quantum-circuit-design method and system illustrated in FIG. 6. The quantum-circuit-design method and system selects a particular canonical-form circuit $u_q^{cc}$ 702, from among a large number of canonical-form quantum circuits 704 stored within a database, that can be used to generate the minimum-cost design within a distance-metric value $\epsilon$ of the target circuit u. The large number of canonical-form quantum circuits is a set of canonical-form quantum circuits $CC_x$ that represents an enumeration of canonical-form quantum circuits having a length, in TH and SH gates, less than or equal to x.

$$CC_x = \{u^{cc} \in CC | \text{length}(u^{cc}) \leq x\}.$$

Of course, the currently disclosed design method can be used to provide a design for an input circuit u even when $CC_x$ is not a complete enumeration of the canonical-form quantum circuits, in general, although the fewer canonical-form quantum circuits in $CC_x$, the lower the probability that the design method produces a suitable design for an arbitrary input u. As shown in FIG. 7, the design process can be considered to first generate a candidate subset of $CC_x$, $CC'_x$, with the elements in the candidate subset $CC'_x$ comprising those canonical-form quantum circuits from which a design can be generated within a distance-metric value $\epsilon$ of the target PSU(2) quantum circuit u, $$CC'_x = \{u^{cc} \in CC_x, g_1 \in CPH, g_2 \in CPH | \text{distance}(u, g_1 u^{cc} g_2) < \epsilon)\}$$

and then selecting, as the quantum-circuit design, a $u^{cc}$ from $CC'_x$ with lowest cost:

$$u_q^{cc} = \operatorname*{argmin}_{u^{cc} \in CC'_x} \text{cost}(u^{cc}).$$

However, as discussed below, an efficient search can be used to identify a minimum-cost design without necessarily generating or evaluating the elements of a candidate set $CC'_x$. As discussed in the previous subsection, the trace of a unitary matrix is equal to the sum of its diagonal element:

$$tr\left(\begin{bmatrix} a & b \\ -b^* & a^* \end{bmatrix}\right) = a + a^* = \operatorname{Re}(a) + i\operatorname{Im}(a) + \operatorname{Re}(a^*) - i\operatorname{Im}(a) = 2\operatorname{Re}(a).$$

As also discussed above, one distance metric that can be used to determine the distance between two quantum circuits u and v is provided by the expression:

$$\operatorname{dist}(u,v) = \sqrt{(2 - |tr(u \cdot v^\dagger)|)/2}.$$

When the distance, as determined by the above distance metric, between two quantum circuits u and v is less than $\epsilon$, then the absolute value of the difference of the absolute values of the traces of the two quantum circuits is less than $4\epsilon$:

$$\operatorname{dist}(u,v) < \epsilon \Rightarrow ||tr(u)| - |tr(v)|| < 4\epsilon.$$

As discussed in the preceding subsection, any quantum circuit u' in $U_{(T,H)}$ or $U_{(T,H,SH)}$ can be expressed as a double coset of a canonical-form quantum circuit, and a given u in PSU(2) can be approximated as closely as desired by a quantum circuit u' selected from $U_{(T,H)}$. However, in certain of the database-search-based quantum-circuit-design methods and systems to which the current application is directed, canonical-form quantum circuits are enumerated and stored only up to some maximum length x, and, in all other cases, the database is also finite. As a result, because the design methods and systems attempts to map an infinite group onto a finite set, there is no guarantee that the design methods and systems can find a canonical-form-circuit-based design within a distance-metric value $\epsilon$ of a given quantum circuit u in PSU(2). Therefore, the quantum-circuit-design method and system to which the current application is directed returns either the lowest cost quantum circuit within a distance $\epsilon$ of the target quantum operation u or an indication that no circuit design within a distance of $\epsilon$ of the input quantum circuit u can be found.

In order to facilitate efficient search quantum-circuit designs in a database of canonical-form quantum circuits, the database is organized to take advantage of various properties of canonical-form quantum circuits. The database organization is next described with reference to FIGS. 8-18.

Figure 8:
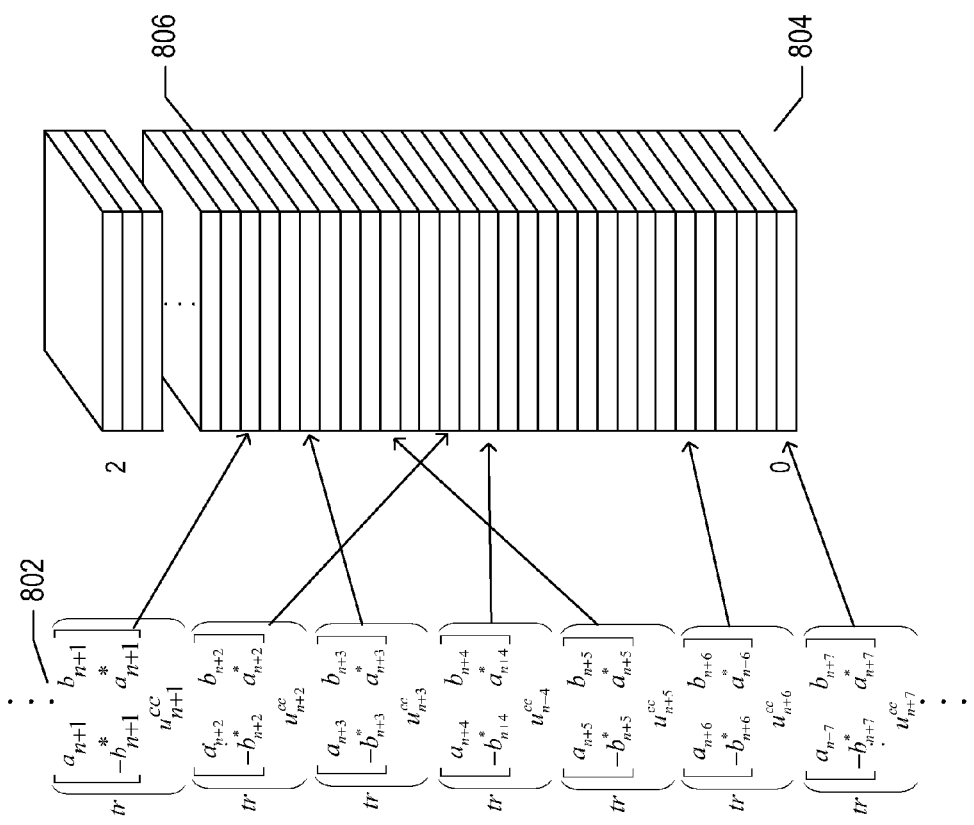
FIG. 8 illustrates partitioning of canonical-form circuits by trace value.

FIG. 8 illustrates partitioning of canonical-form quantum circuits by trace value. As shown in FIG. 8, the trace values of all possible canonical-form circuits up to some maximum length or, as discussed above, the trace values of all canonical-form quantum circuits in the set $CC_x$ 802, can be used to partition $CC_x$ into a set of partitions 804. It should be noted that a canonical-form quantum circuit can be expressed as s sequence of standard gates, but can also be expressed as a 2×2 unitary matrix generated by combining the standard gates of the sequence by matrix multiplication. The trace value of a canonical quantum circuit is therefore the trace of the 2×2 unitary matrix corresponding to the canonical-form quantum circuit. All quantum-circuit elements of $CC_x$ having a particular absolute value of the trace value of the quantum circuit, or, in other words, all quantum-circuit elements of $CC_x$ with the same absolute trace value, are assigned to a particular bin or partition, such as bin or partition 806 in a set of partitions 804. In FIG. 8, the partitions are illustrated as rectangular volumes. The absolute trace values for unitary 2×2 matrices range from 0 to 2. These partitions or bins are referred to, below, as "trace levels" and can be ordered, as shown in FIG. 8, according to absolute trace value ranging from 0 to 2.

FIG. 9 illustrates a trace sphere. As shown in FIG. 9, a particular trace level 902 can be alternatively considered to be a two-dimensional trace sphere 904. The surface of this unit sphere contains points corresponding to those canonical-form quantum circuits having the particular absolute trace value associated with the trace sphere. An interesting property of canonical-form quantum circuits is that the number of T gates, one measure of circuit cost, of all canonical-form quantum circuits with a particular absolute trace value is identical.

Figure 10:
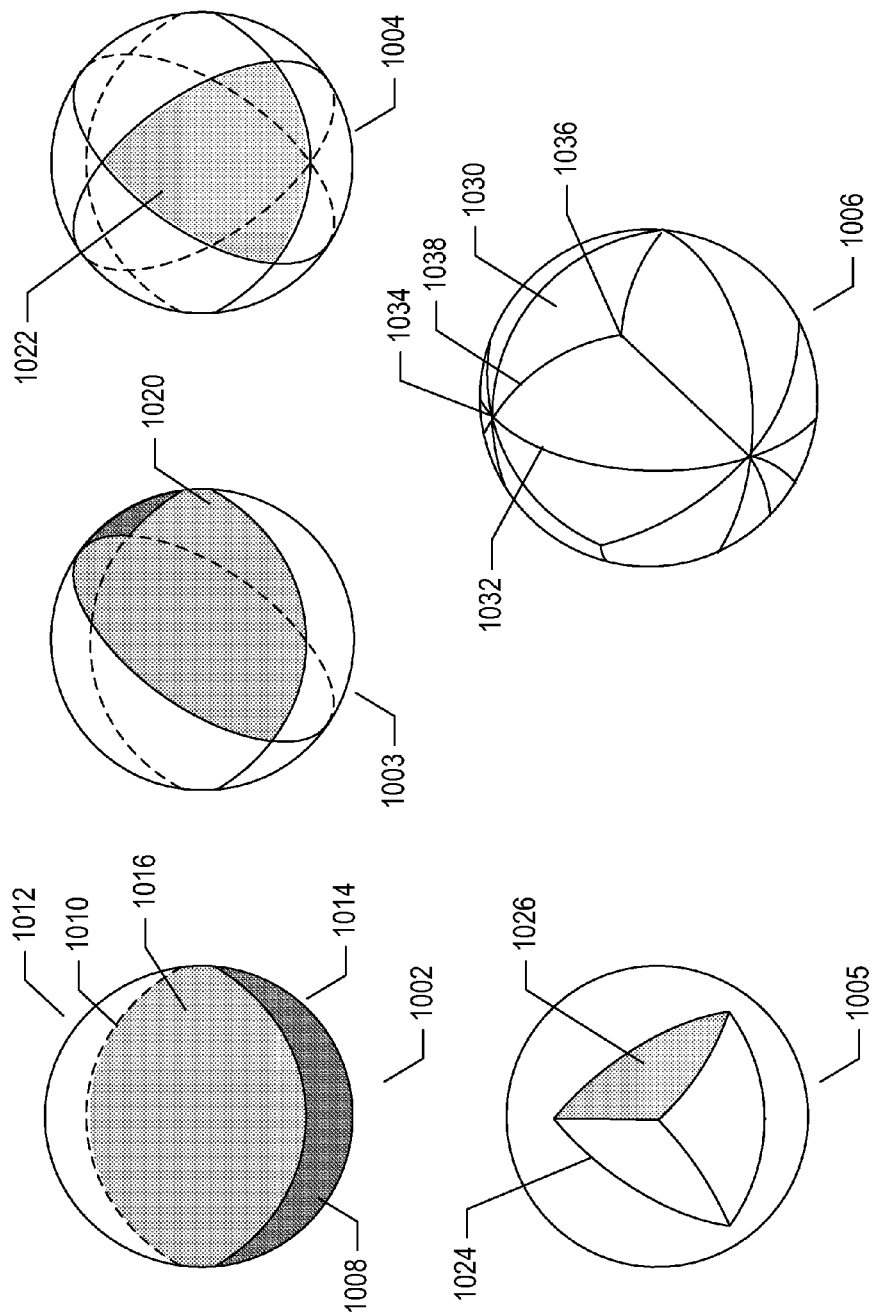
FIG. 10 illustrates a useful tiling of the surface of a sphere.

FIG. 10 illustrates a useful tiling of the surface of a trace sphere. This tiling, as discussed below, is used to further partition, or characterize, the canonical-form quantum circuits within a particular trace level. FIG. 10 shows a progression of partitionings of the surface of the trace sphere 1002-1005 that lead to a final tiling 1006. In the first partitioning, an equatorial line 1010 is inscribed in the surface of the sphere, dividing the surface of the sphere into two hemispheres 1012 and 1014. In FIG. 10, the top hemisphere 1012 is unshaded and the lower hemisphere 1014 is shaded, with lighter shading 1016 indicating the portion of the surface viewed through the upper, unshaded hemisphere 1012 and darker shading 1018 indicating the portion of the lower hemisphere viewed directly from an external viewpoint. Next, as shown in partitioning 1003, a second equatorial line is inscribed in the surface of the sphere to divide the surface of the sphere into four equal quadrants, including the shaded quadrant 1020. In this discussion, the terms "quadrant" and "octant" may refer either to a solid volume within a spherical volume or to the curved, external surface of the solid-volume quadrant or octant. In the partitioning shown in FIG. 1004, an additional equatorial line is inscribed in the surface of the sphere to divide the surface of the sphere into eight identically shaped and identically sized octants, including shaded octant 1022. As shown in partitioning 1005, each octant, such as octant 1024, can be further partitioned into three identically shaped and identically sized tiles, such as shaded tile 1026. Partitioning 1006 displays the visible portion of the external surface of the trace sphere fully partitioned into tiles.

The tiling shown in FIG. 10 has octahedral symmetry. In addition to the tiles, such as tile 1030, the tiling described in FIG. 10 also includes edges, such as edge 1032, that separate one tile from another, and vertices, such as vertex 1034 and vertex 1036, where multiple edges intersect. The tiles, edges, and vertices are related by octahedral symmetry operations. There are 14 different vertices of two kinds, including eight vertices, such as vertex 1036, at the center of octants and coincident with 3-fold axes and six vertices, such as vertex 1034, at which eight different edges meet and which are coincident with 4-fold axes. There are 36 different edges, including 12 edges, such as edge 1032, that form the boundaries of octants, and 24 edges, such as edge 1038, that form tile boundaries internal to octants.

Figure 11:
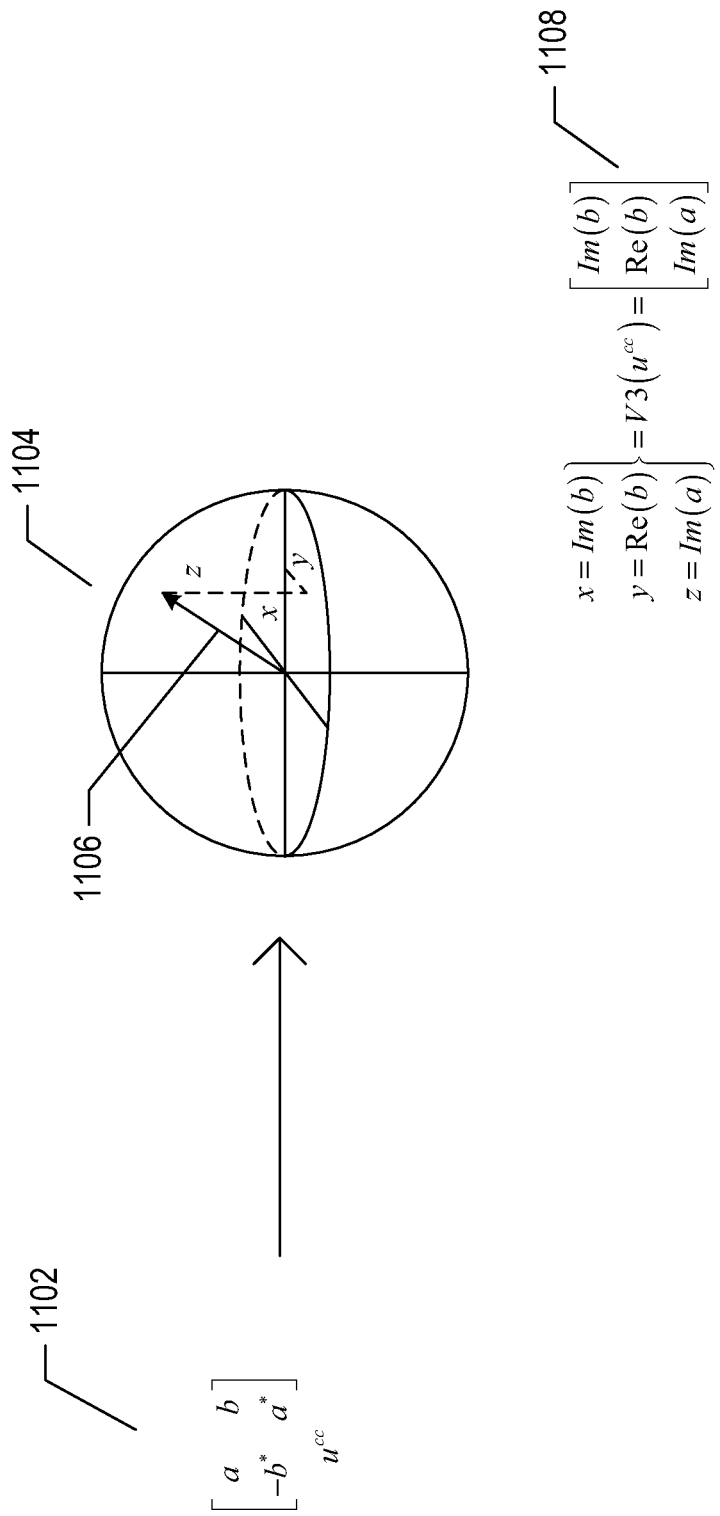
FIG. 11 illustrates mapping of a canonical-form circuit, expressed in 2×2 matrix form, to a position on the surface of a trace sphere.

FIG. 11 illustrates mapping of a canonical-form circuit, expressed in 2×2 matrix form, to a position on the surface of a trace sphere. The absolute trace value of the canonical-form quantum circuit $u^{cc}$ 1102 selects a particular trace sphere 1104 from among all of the trace spheres corresponding to trace levels. The trace sphere is given an orthonormal coordinate system and the given canonical-form circuit $u^{cc}$ is mapped, by an operation $V_3$, to a three-dimensional vector within this coordinate system 1106. The $V_3$ mapping 1108 generates x, y, and z coordinate values from the imaginary part of the b complex value, the real portion of the b complex value, and the imaginary portion of the a complex value, respectively, where the a and b complex values are the a and b values in the 2×2 matrix representation of the canonical-form quantum circuit $u^{cc}$. The endpoint 1110 of the vector $V_3(u^{cc})$ on the surface of the trace sphere is the location or position of $u^{cc}$ in the trace sphere.

Figure 12:
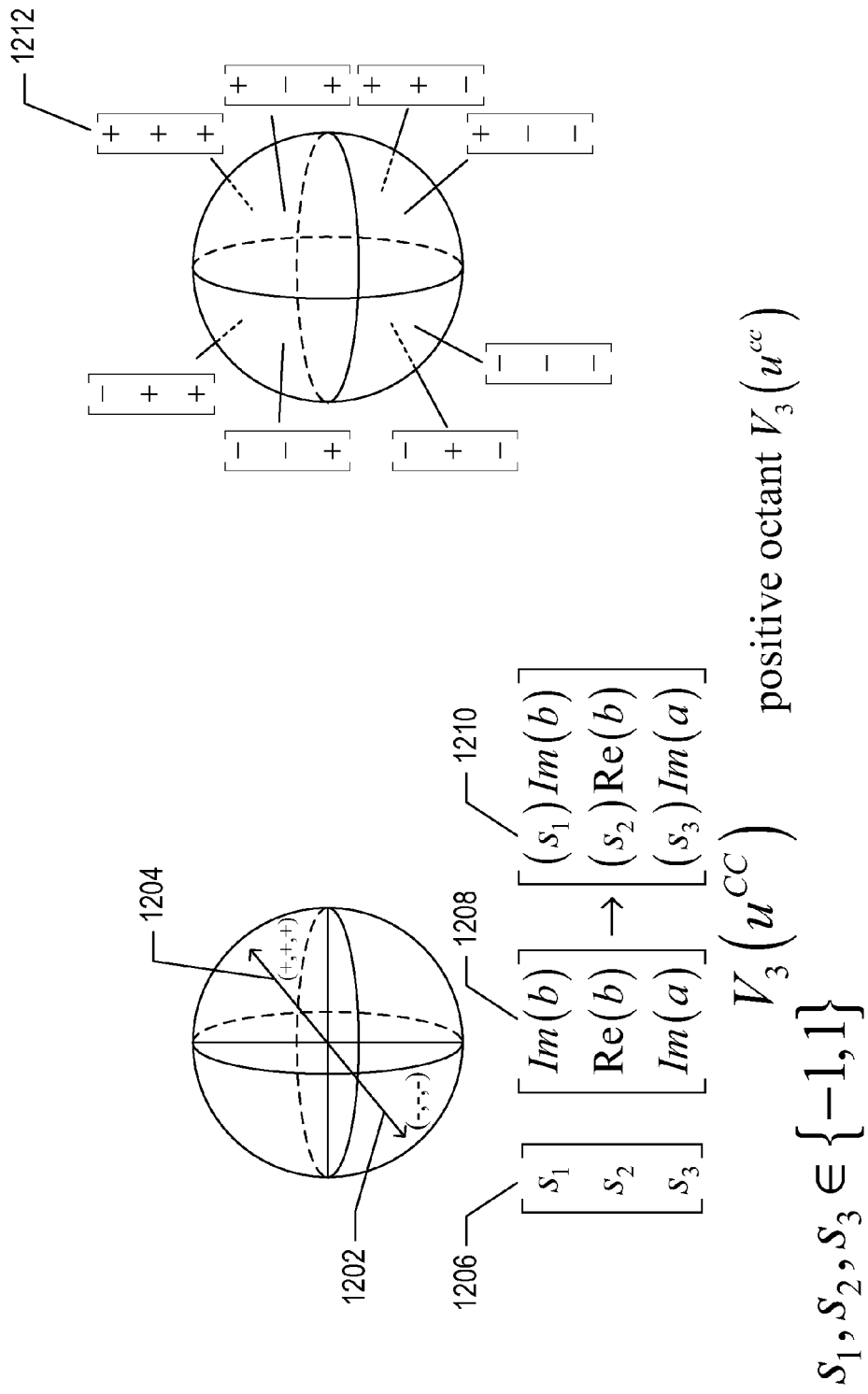
FIG. 12 illustrates determination of the octant of a trace sphere that contains the position or location of a particular canonical-form quantum circuit.

FIG. 12 illustrates determination of the octant of a trace sphere that contains the position or location of a particular canonical-form quantum circuit. As shown in FIG. 12, an arbitrary vector 1202 described within the trace sphere can be rotated into the positive octant 1204, in which the elements of a vector are all positive, by changing the signs of one or more of the coordinate values, or vector elements, in the vector. This operation of rotating an arbitrary vector into the positive octant can be expressed as the Shur product of a sign vector 1206 and a given, arbitrary vector 1208 corresponding to a canonical-form quantum circuit that rotates the vector corresponding to the canonical-form quantum circuit into the positive octant 1210. All vectors in a particular octant are rotated to the positive octant by one particular sign vector, and, therefore, each octant of the trace sphere is associated with a corresponding sign vector. For example, all elements of the sign vector 1212 corresponding to the positive octant are equal to "+" or "1." Therefore, the sign vector 1206 that rotates a particular vector $V_3(u^{cc})$ to the positive octant provides an indication of the octant of the trace sphere in which $V_3(u^{cc})$ resides.

Figure 13:
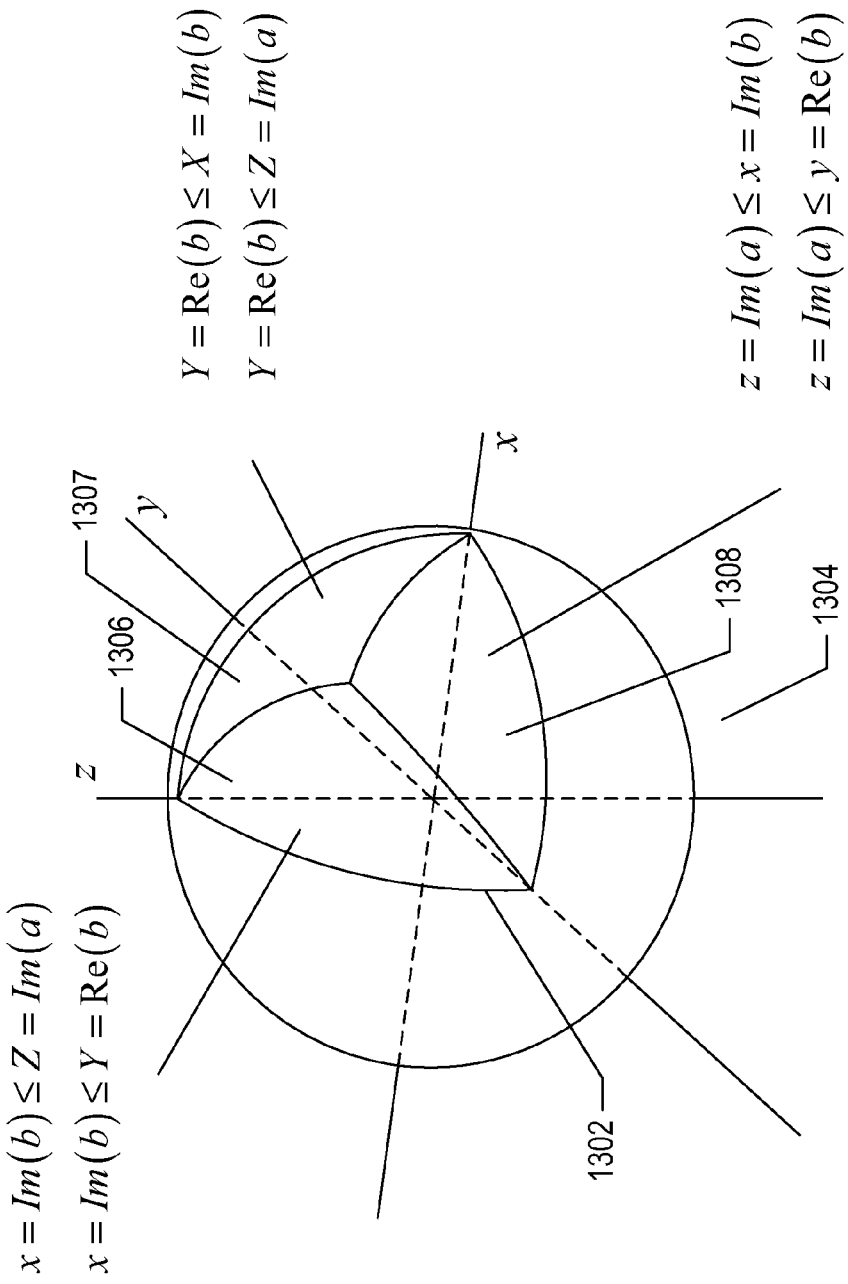
FIG. 13 illustrates determination of a tile within a trace sphere to which the vector $V_3(u^{cc})$ corresponding to a canonical-form quantum circuit points.

FIG. 13 illustrates determination of a tile within a trace sphere to which the vector $V_3(u^{cc})$ corresponding to a canonical-form quantum circuit points. As shown in FIG. 13, for a particular octant 1302 of a trace sphere 1304, each of the three tiles 1306-1308 corresponds to areas of the octant in which the numeric value of one coordinate of the vector $V_3(u^{cc})$ is less than those of the other two coordinates. Therefore, the relative numeric values of the coordinates or elements of the vector $V_3(u^{cc})$ can be used to identify the particular tile within a particular octant of a trace sphere in which a given vector $V_3(u^{cc})$ resides. Thus, as discussed with reference to FIGS. 8-13, each canonical-form quantum circuit $u^{cc}$ in $CC_x$ can be assigned, by absolute trace value, to a particular trace sphere and can represented as a location on the trace sphere corresponding to the end point of a vector $V_3(u^{cc})$. In general, the vector $V_3(u^{cc})$ resides within a particular tile of the tiling discussed above with reference to FIG. 10, and that tile can be determined by a combination of a sign vector and the relative numerical values of the elements of the vector $V_3(u^{cc})$.

As discussed above, the design process attempts to map a given quantum circuit u in PSU(2) to a quantum-circuit design comprising a double coset of a canonical-form quantum circuit $u^{cc}$:

$$u \to g_1 u^{cc} g_2$$

where $$g_1, g_2 \in CPH.$$

The above expression is equivalent to $g_1^{-1} u g_2^{-1} \to u^{cc}$, where $g^{-1}$ is the inverse element of CPH to element g such that $g^{-1}g = gg^{-1} = Id$. Because CPH is a group, of course, the inverse of any element of the group is also a member of the group, and thus the above expression can be alternatively written as:

$$g_a u g_b \to u^{cc}.$$

The adjoint operation on a quantum circuit u, $Ad_g[u]$, where $g \in CPH$, is defined as:

$$Ad_g[u] = g u g^{-1}.$$

Therefore:

$$Ad_{g_a}[u \cdot h] = g_a u g_b = g_1^{-1} u g_2^{-1}$$

where $$g_a = g_1^{-1},$$

$$g_b = g_2^{-1}, \text{ and}$$

$$h = g_b g_a = g_2^{-1} g_1^{-1}.$$

In other words, by simple algebraic transformation, a search of $CC_x$ to find a $u^{cc}$ that can be used to generate a design $g_1 u^{cc} g_2$ for an input u is transformed into a search of $CC_x$ to find a $u^{cc}$ equal or close to $Ad_g[u \cdot h]$, where g and h are not necessarily distinct elements of CPH. Once the $u^{cc}$ is identified, then a design for the target quantum operation u can be produced by:

$$g^{-1} u^{cc} g h^{-1}.$$

Figure 14:
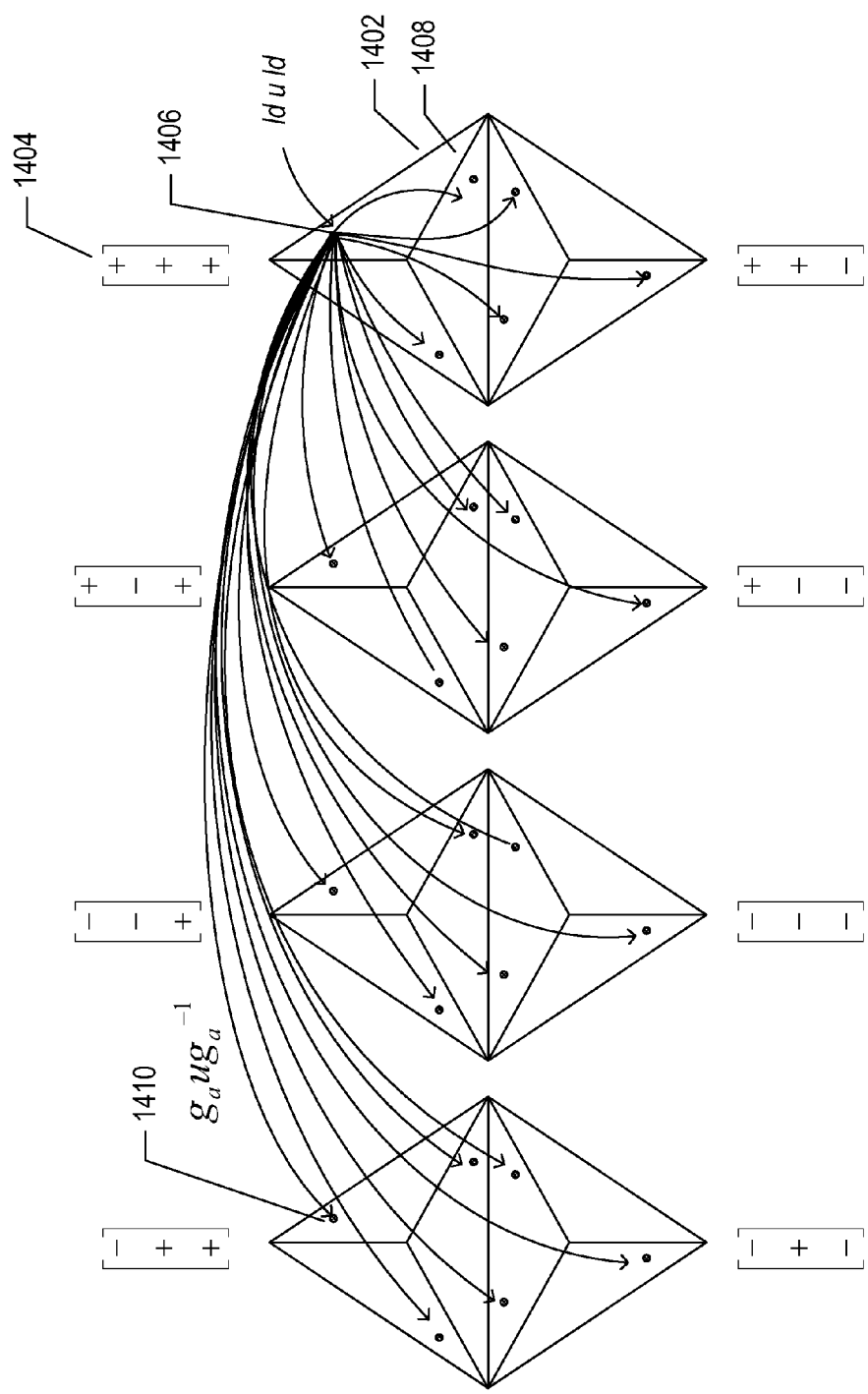
FIG. 14 illustrates the adjoint operation as a symmetry operation.

FIG. 14 illustrates the adjoint operation as a symmetry operation. In FIG. 14, the tiling 1006 in FIG. 10 is projected onto a plane. Each octant, in plane projection, becomes a triangle. The plane-projected octants, in FIG. 14, are labeled with their corresponding sign vectors. For example, octant 1402, the positive octant, is labeled with sign vector 1402. The plane's projection can be imagined as cutting the tiled spherical surface 1006 in FIG. 10 along octant boundaries from both the north pole and south pole to the equator, then cutting a point on the equator connecting the positive octant to the octant with positive y and z values and negative x values, and then flattening the spherically curved octants onto the plane. Given that a particular vector $V_3(u^{cc})$ corresponding to the canonical-form quantum circuit $u^{cc}$ positions $u^{cc}$ at the point 1406 within tile 1408 of octant 1402, adjoint operations based on each of the non-identity CPH elements are equivalent to symmetry operations that generate 23 equivalent positions on each of the remaining 23 tiles. Each of these 23 equivalent positions has the same relative location within its respective tile as point 1406 within tile 1408. For example, the adjoint operation with CPH member $g_a$ generates position 1410 from position 1406. When a position of a canonical-form circuit coincides with an edge or vertex, certain of the 23 symmetry operations are redundant. As one example, when the location of $u^{cc}$ coincides with a vertex that is, in turn, coincident with a 3-fold axis, application of the adjoint operation with all 24 CPH members leads to only 7 additional equivalent positions.

The quantum-circuit design methods and systems to which the current application is directed generate up to 576 different search locations, or neighborhoods, within the entire trace space of $CC_x$ in which to search for the minimum-cost equivalent or approximate canonical-form circuits. These search locations are obtained by applying the adjoint operation to right cosets of the input PSU(2) quantum circuit u:

search locations={location($u'$)|$g \in CPH, h \in CPH, u' = Ad_g[u \cdot h]$}.

The right-coset operation generally results in a unitary matrix with a different trace value than that of the unitary matrix to which the right-coset operation is applied:

|tr($u \cdot h$)| generally does not equal |tr($u$)|.

However, the adjoint operation preserves the trace value:

|tr($Ad_g[u]$)|=|tr($u$)|.

Therefore, the search locations produced by the double-coset operation on u, equivalent to $Ad_g(u \cdot h)$, generates at most 24 neighborhoods within each of 24 different trace levels or thin shells of adjacent, concentric trace levels.

Figure 15:
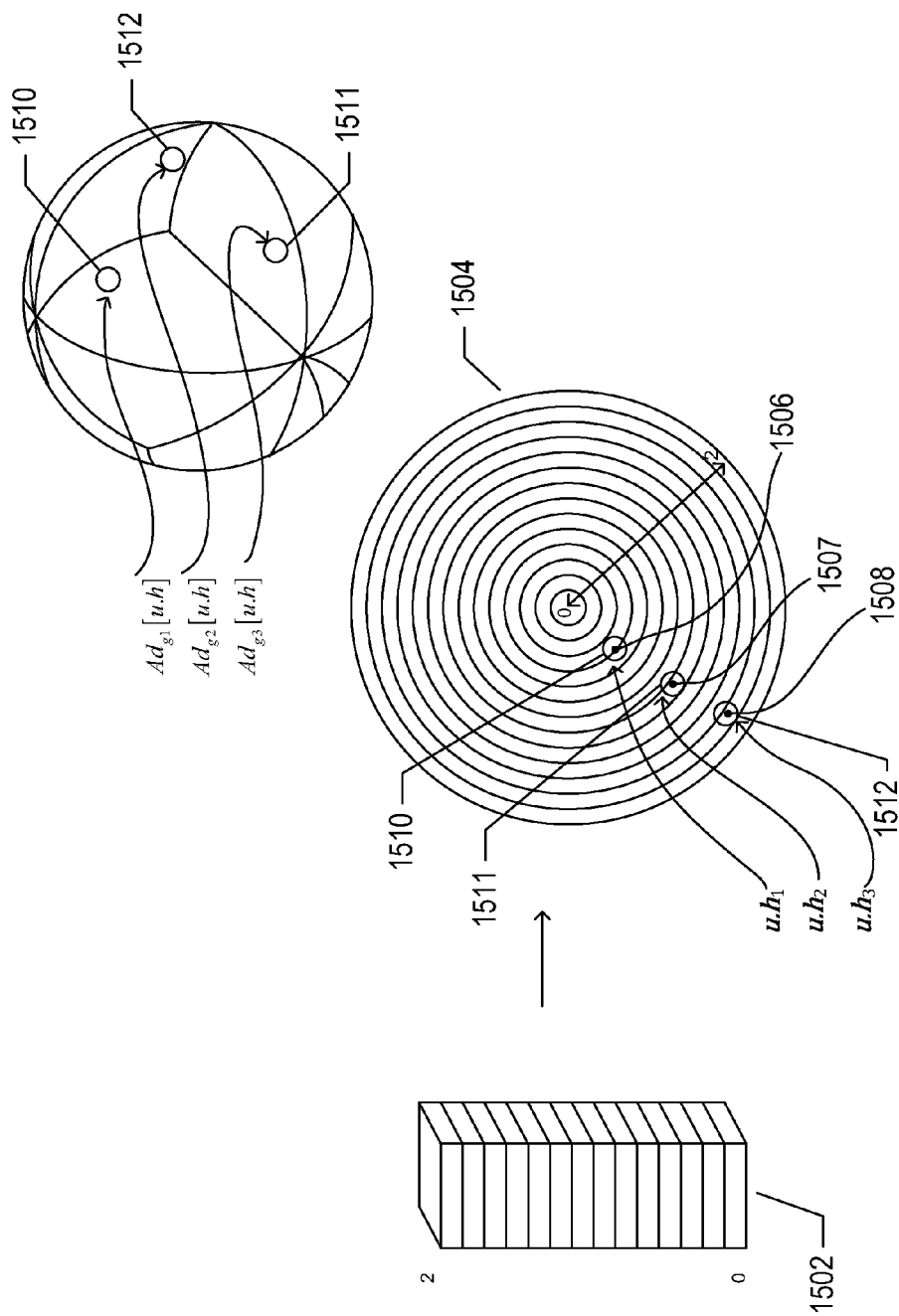
FIG. 15 illustrates the search neighborhoods generated by $Ad_g[u \cdot h]$ within the trace space of a canonical-form quantum-circuit database.

FIG. 15 illustrates the search neighborhoods generated by $Ad_g[u \cdot h]$ within the trace space of a canonical-form quantum-circuit database. As discussed above, the trace space for a canonical-form set or database CG comprises a set of trace levels 1502. As also discussed above, each of the trace levels can alternatively be considered to be a trace sphere, and, as shown in FIG. 15, these trace spheres can be considered to be concentrically arranged to produce a trace space 1504, shown in cross-section, with each circle corresponding to a vertical section of a different trace sphere. As shown in FIG. 15, the right-coset operation on a quantum circuit u by different $h_i$ elements of CPH generally generate positions with different trace levels 1506-1508 within the trace space. Neighborhoods described by spherical volumes 1510-1512, respectively, about these points represent search neighborhoods in the trace space 1504 for identifying candidate canonical-form quantum circuits corresponding to $Ad_g[u \cdot h]$. From each of these neighborhoods, such as neighborhood 1510, the adjoint operation using different elements of CPH generate symmetry-related neighborhoods 1511 and 1512 within the same trace sphere or set of concentric, adjacent trace spheres.

As discussed above, with reference to FIG. 15, generation of all possible double coset compositions of the input PSU(2) quantum circuit u generates up to 576 locations in the trace space for $CC_x$ about which searches are conducted to find canonical-form circuits. Again, when the position of u coincides with, or is near to, an edge or vertex of the tiling 1006 in FIG. 10, fewer neighborhoods may be generated by the adjoint operation, and the trace levels of the circuits generated by the right-coset operation are not always distinct. The size of the neighborhoods is determined by the maximum difference $\epsilon$ in a distance metric that can be tolerated or, in other words, by the desired precision or accuracy of approximation of the input quantum circuit u.

Figure 16:
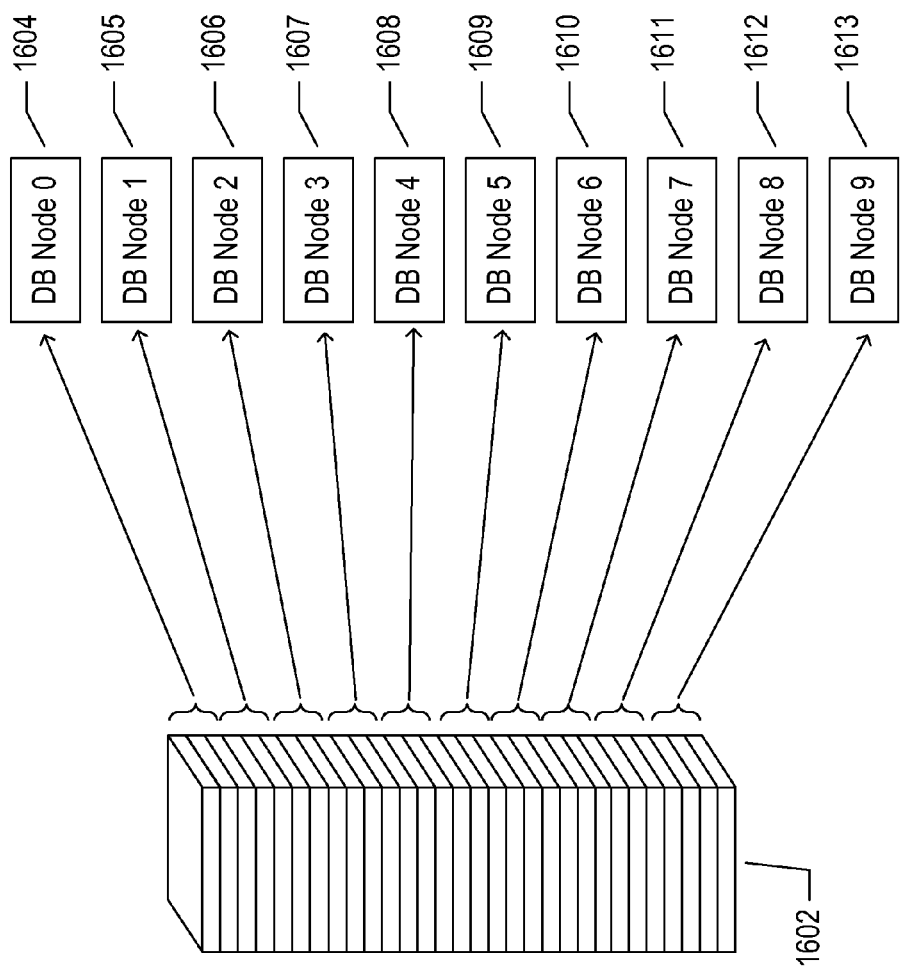
FIG. 16 illustrates distribution of the database-search-based quantum-circuit method among multiple nodes within a database-search-based quantum-circuit-design system.

FIG. 16 illustrates distribution of the database-search-based quantum-circuit method among multiple nodes within a database-search-based quantum-circuit-design system. The trace levels 1602 for the database of canonical-form circuits $CC_x$ can be distributed among multiple quantum-circuit database-search-based design-system nodes 1604-1613. In general, multiple adjacent trace levels are distributed to each system node. In the case that the right-coset operation on u generates 24 different trace levels or sets of adjacent trace levels, then 24 or more distributed nodes can concurrently search 24 different trace spheres or thin shells of concentric trace spheres in order to find a minimum-cost canonical-form-based design for the input quantum circuit u. The entire trace sphere or shell of adjacent concentric trace spheres may be searched. However, as discussed above with reference to FIG. 15, the adjoint operation distributes a search neighborhood generated by the right-coset operation to a maximum of 23 additional location-based neighborhoods that are equivalent under the adjoint operation. Furthermore, as discussed above, these up to 24 different neighborhoods distributed about the trace sphere or thin shell of concentric, adjacent trace spheres have the same relative positions within each of the 24 symmetry-related tiles. Because, in general, the total area of these up-to-24 search neighborhoods distributed symmetrically across the trace sphere are significantly smaller than the area of the trace sphere, increased efficiency in database searching is obtained by attempting to take advantage of the symmetry properties of the adjoint operation in distributing search neighborhoods within a trace sphere.

Next, one possible implementation of the distributed canonical-form quantum-circuit database is discussed, along with methods employed by a database-search-based quantum-circuit-designed system. In order to simplify the description of this system, the system is a fixed-precision system that identifies the minimum-cost canonical-form-based quantum-circuit design that differs, in distance, from the target quantum operation u by no more than $\epsilon$. With modest additional complexity, a database-search-based quantum-circuit design system can be implemented to find a minimum-cost design of a specified level of accuracy or that falls within a maximum, specified allowable metric distance $\epsilon$ from the target quantum operation u.

Figure 17:
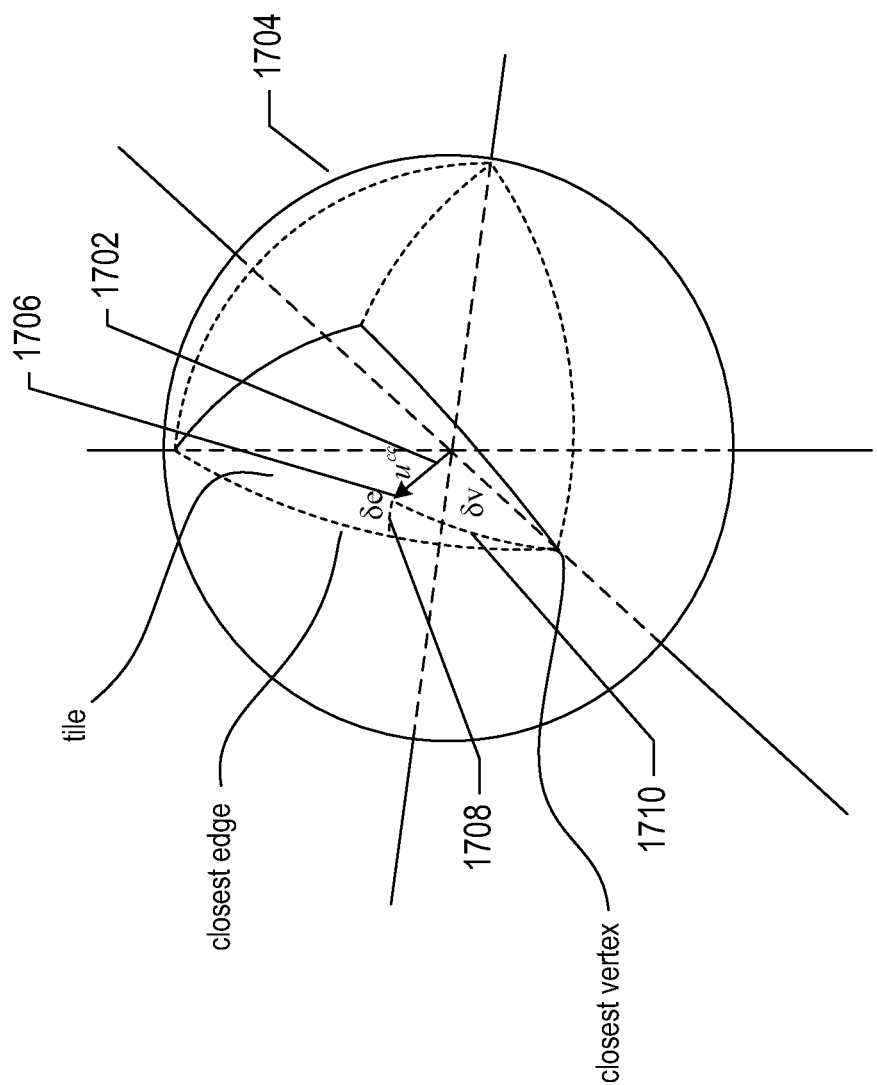
FIG. 17 illustrates characterization of the location of a canonical-form quantum circuit on the surface of a trace sphere.

FIG. 17 illustrates characterization of the location of a canonical-form quantum circuit on the surface of a trace sphere. As discussed above, the canonical-form quantum circuit is transformed into a three-dimensional vector 1702 inscribed within the trace sphere 1704. The vector is normalized and the end point of the vector 1706 falls on the surface of the trace sphere at a particular location. By relatively straightforward operations, including dot-product operations between the vector 1702 and vectors that define special points on the trace sphere, such as vertices, it is possible to determine the distance $\delta e$ 1708 between the position on the trace sphere 1706 defined by the vector and the closest edge and the distance $\delta v$ 1710 from the location 1706 defined by vector 1702 and the closest vertex 1710. As discussed above, the tile in which the location 1706 defined by vector 1702 is located can be determined from the sign vector and relative numerical values of the vector elements. Using the identity of the tile, identity of the closest edge, the distance to the closest edge $\delta e$, the identity of the closest vertex, and the distance to the closest vertex $\delta v$, the canonical circuits can be organized within each node of the database-search-based quantum-circuit design system to facilitate a computationally straightforward and efficient search for minimum-cost canonical circuits from which a quantum circuit, using standard gates, can be generated to match, within some maximum metric distance E, a given quantum circuit u in PSU(2).

Figure 18:
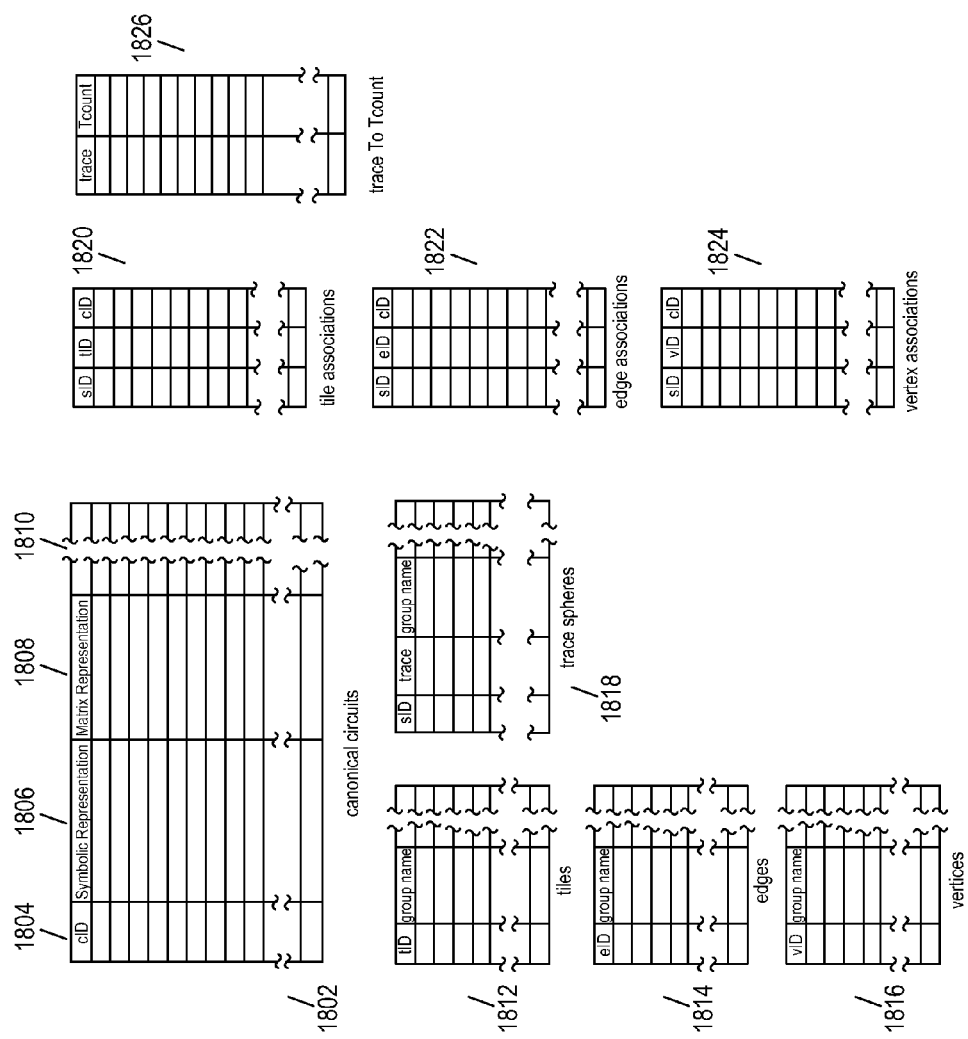
FIG. 18 illustrates various database tables used to implement a canonical-form-circuit database that is searched to produce quantum-circuit designs.

FIG. 18 illustrates various database tables used to implement a canonical-form-circuit database that is searched to produce quantum-circuit designs. These tables are stored in each system node across which the canonical-form quantum-circuit database and design system is distributed. FIG. 18 illustrates the various tables in relational-database-table form. However, use of relational-database-table form does not imply that a relational database is the optimal data-storage technology for canonical-form quantum-circuit databases. Alternatives include various types of indexed file systems, object-oriented databases, and other types of data-storage technologies.

The table canonical circuits 1802 stores an entry for each canonical-form quantum circuit contained within the trace spheres handled by a particular system node. Various different types of information may be stored in the entry to describe a particular canonical-form quantum circuit, including a numeric, unique canonical-form quantum circuit identifier, cID, 1804, a symbolic representation of a canonical-form quantum circuit 1806, a matrix-representation of the canonical-form quantum circuit 1808, and other, additional information 1810. The three tables tiles 1812, edges 1814, and vertices 1816 list IDs, group names, and perhaps additional information about each of the tiles, edges, and vertices in a trace sphere. Thus, the table tiles includes 24 entries with 24 different, unique, tile identifiers, or tIDs. The table edges includes 36 different entries, each described by a unique edge identifier, eID, a group name, and additional information, and the table vertices includes 14 different entries, each with a unique vertex identifier, vID, a group name, and perhaps additional information. The table trace spheres 1818 includes an identifier, a numeric trace-level value, and perhaps additional information about each of the trace spheres handled by the system node. The tables tile associations 1820, edge associations 1822, and vertex associations 1824 contains associations of canonical circuits with particular tiles, edges, and vertices of one of the trace spheres handled by the system node. In systems that allow for design of quantum circuits with specified levels of precision by specifying a maximum distance-metric value $\epsilon$, the tile, edge, and vertex associations tables can be implemented to include additional distance information. The table tile associations includes an entry for each canonical-form circuit in the table canonical circuits 1802 that is no closer than a distance proportional to $\epsilon$ to an edge. In other words, an entry in the table tile associations specifies a tile and trace sphere within which the tile is located corresponding to the position of a canonical-form circuit in the trace space. When a canonical-form circuit is located within a distance $\delta$ somewhat greater than $2\epsilon$ from a particular edge, then an entry for the canonical-form circuit specifying the edge and trace sphere so associated with the canonical-form circuit is entered into the table edge associations. Similarly, when a canonical-form circuit is within a distance $\delta$ somewhat greater than $2\epsilon$ from a vertex, then an association of a canonical-form circuit and the vertex is entered in the table vertex associations. Finally, the table traceToTcount 1826 stores the Tcount or, in alternative implementations, another cost metric for all of the canonical-form circuits having a particular trace value and therefore located within a particular trace sphere. Cost metrics may include the number of a particular type of gate, pair of gates, or other combinations of gates that occur in a symbolic representation of a quantum circuit, a length in symbols, pairs, of symbols, or another such length metric with respect to the symbolic representation of a quantum circuit, or any of many additional types of cost metrics. For example, the cost function may be quantized, with circuits having a range of numbers of particular gates or combinations of gates or a range of lengths assigned to each bin, and with a common cost metric returned for the circuits in a given bin by the cost function.

FIGS. 19A-F illustrate, using control-flow diagrams, a quantum-circuit design method carried out within a database-search-based quantum-circuit design system. These control-flow diagrams illustrate one of a large number of different possible implementations of a quantum-circuit design method that can be used to search a database of canonical-form quantum circuits in order to identify an acceptable quantum-circuit design for an input quantum circuit u in PSU(2). In step 1902 in FIG. 19A, the matrix representation of an input PSU(2) quantum gate or quantum circuit u is received. In step 1903, the quantum-circuit design method determines whether u has already been designed using the currently employed design method. When quantum circuit u has already been designed by the currently employed method and is available in a database of designed circuits, then, in step 1904, the design is retrieved from the database and returned in step 1905. Otherwise, in the for-loop of steps 1906-1909, each element $h_i$ in CPH is used to compute a circuit $u'_i$ with an absolute trace value $t_i$ and Tcount, or cost, $c_i$, from u. Then, in step 1910, a list of $u'_i/t_i/h_i$ triples generated in the for-loop of steps 1906-1909 is sorted in ascending order by $c_i$, with an index j used for indexing the sorted list of triples. Also, in step 1910, all triples with duplicate $u'_i/t_i$ pairs are coalesced into a single entry in the list of triples. It is assumed, below, that all of the $h_i$ associated with a coalesced entry can be regenerated or retrieved and that coalesced triples can be subsequently identified. Then, in step 1911, the routine "search" is called. Note that the triples generated in the for-loop in steps 1906-1909 correspond to the trace levels generated by the right-coset operation, as illustrated in, and described with reference to, FIG. 15.

Figure 19A:
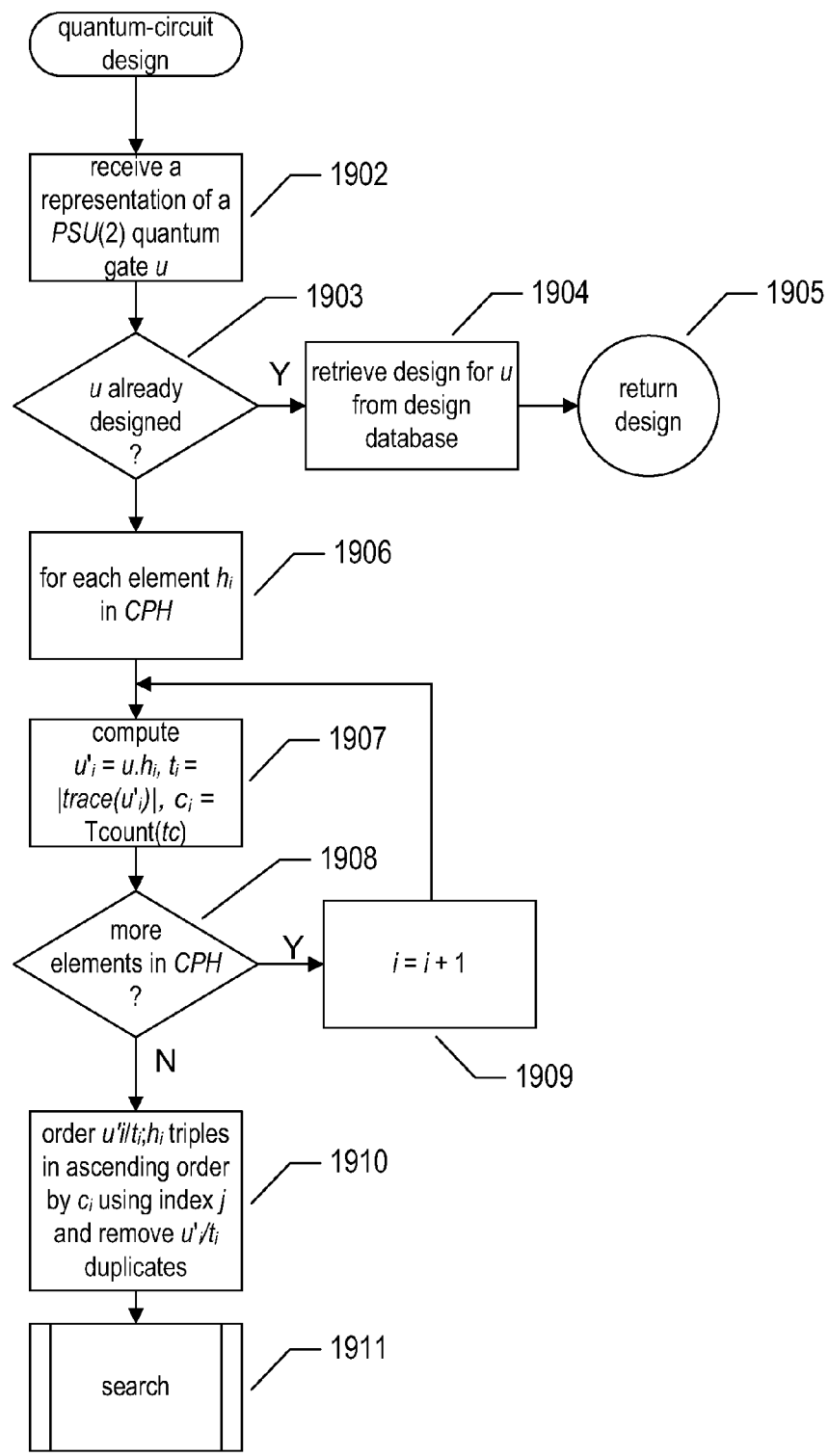
FIGS. 19A-F illustrate, using control-flow diagrams, a quantum-circuit design method carried out within a database-search-based quantum-circuit design system.
Figure 19B:
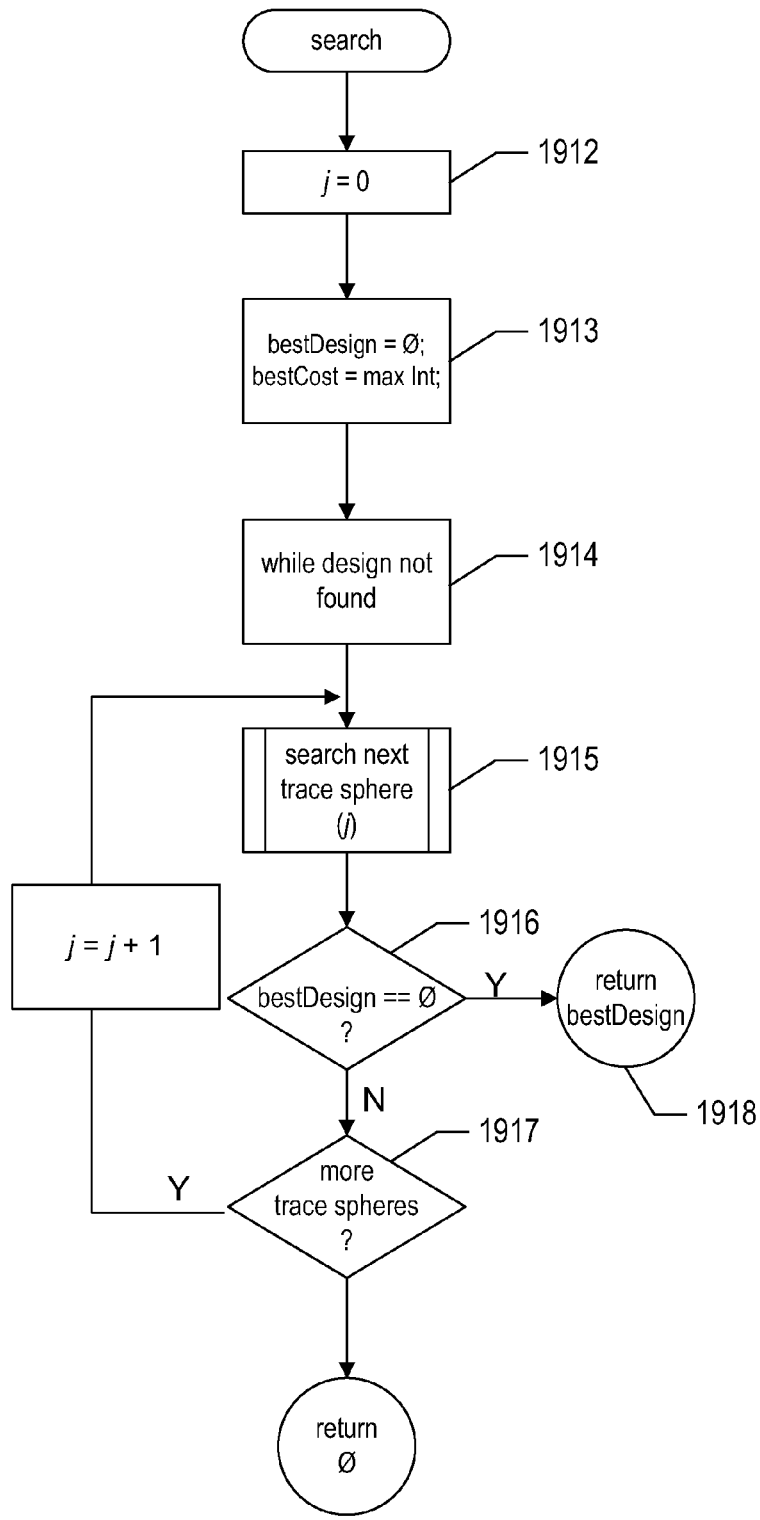

FIG. 19B provides a control-flow diagram for the routine "search," called in step 1911 in FIG. 19A. In step 1912, the index j is set to 0. In step 1913, a local variable "bestDesign" is set to null and a local variable "bestCost" is set to some large value that exceeds the cost of any circuit generated from any canonical-form quantum circuit in the database $CC_x$. In the while-loop of steps 1914-1918, which iterates until all trace spheres or shells of adjacent, concentric trace spheres corresponding to the trace values in the list of triples generated in the for-loop of steps 1906-1909 in FIG. 19A have been considered or until a design has been obtained during the search of a trace sphere. For each trace sphere corresponding to an entry in the list of triples indexed by j, the routine "search next trace sphere" is called, in step 1915. The list of triples is ordered by cost, so as soon as a design is returned, as determined in step 1916, in the search of a next trace sphere, that design can be returned, in step 1918, as the minimum-cost design for the input circuit u. Of course, when the search is distributed across many nodes, the search can proceed in parallel. In the parallel case, the while-loop of steps 1914-1918 would immediately dispatch searches to up to 24 nodes, and would terminate when a design is returned by a node associated with an index j after all nodes associated with indexes less than j have returned an indication of failing to find an acceptable design.

Figure 19C:
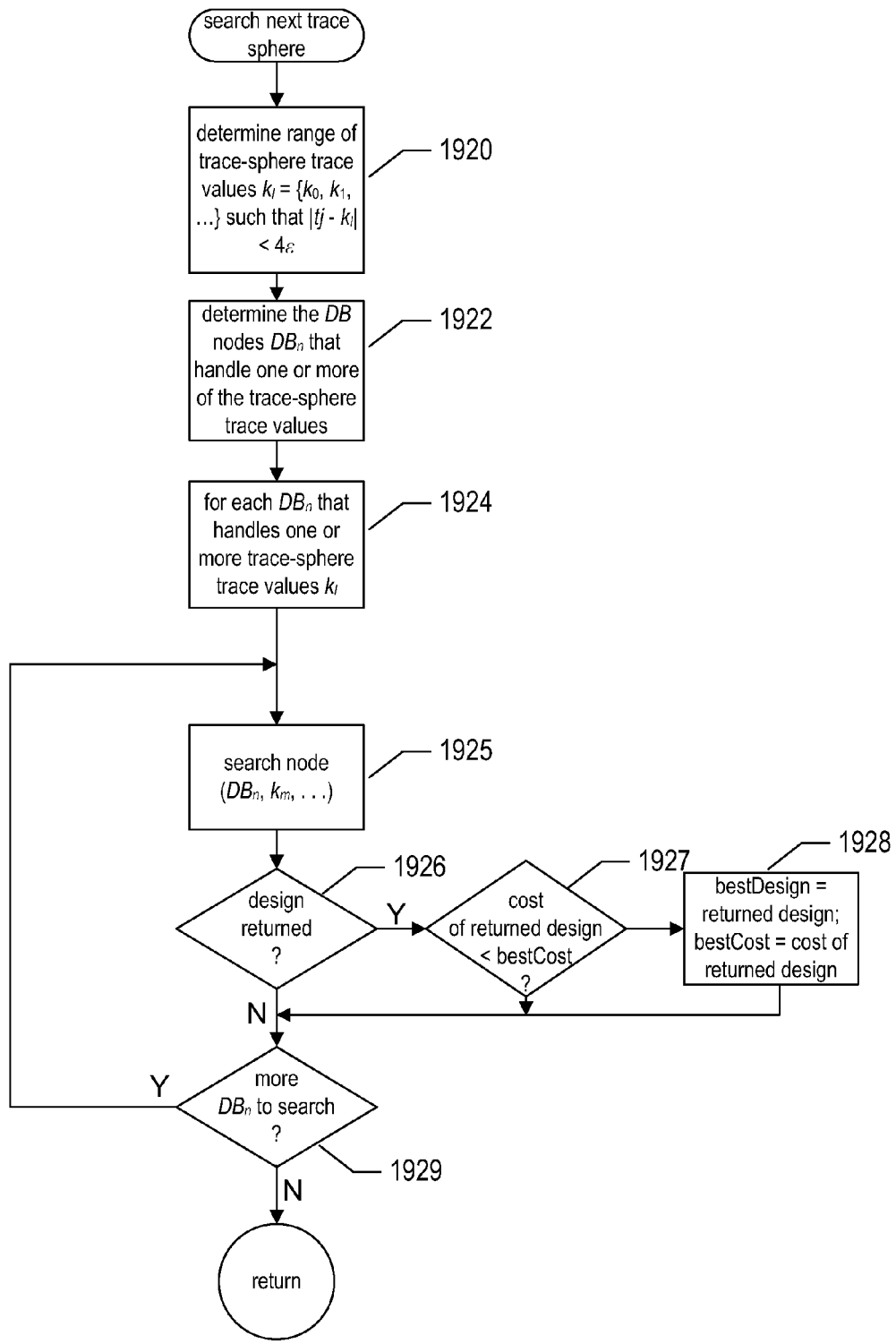

FIG. 19C provides a control-flow diagram for the routine "search next trace sphere" called in step 1915 in FIG. 19B. In step 1920, a range of absolute trace values $k_i$ is determined such that $t_j - k_i < 4\epsilon$. In other words, in step 1920, a trace-level neighborhood for the absolute trace value $t_j$ is generated. In step 1922, the system nodes $DB_n$ that handle one or more of the trace spheres with absolute trace values in the set of trace values $k_i$ are determined. Then, in the for-loop of steps 1924-1929, each of the nodes in $DB_n$ determined in step 1924 are sent a search task represented by a call to the routine "search node." When a system node returns a design as a result of the search, as determined in step 1926, and when the cost of the design is less than the current best cost, as determined in step 1927, then that design becomes the current best design, and the cost of that design becomes the best cost, in step 1928. Thus, for each different trace level, a distributed search is carried out on the system nodes that handle the trace-level neighborhood of the trace level. Again, as discussed above, these searches may be carried out in parallel in a distributed quantum-circuit-design system.

Figure 19D:
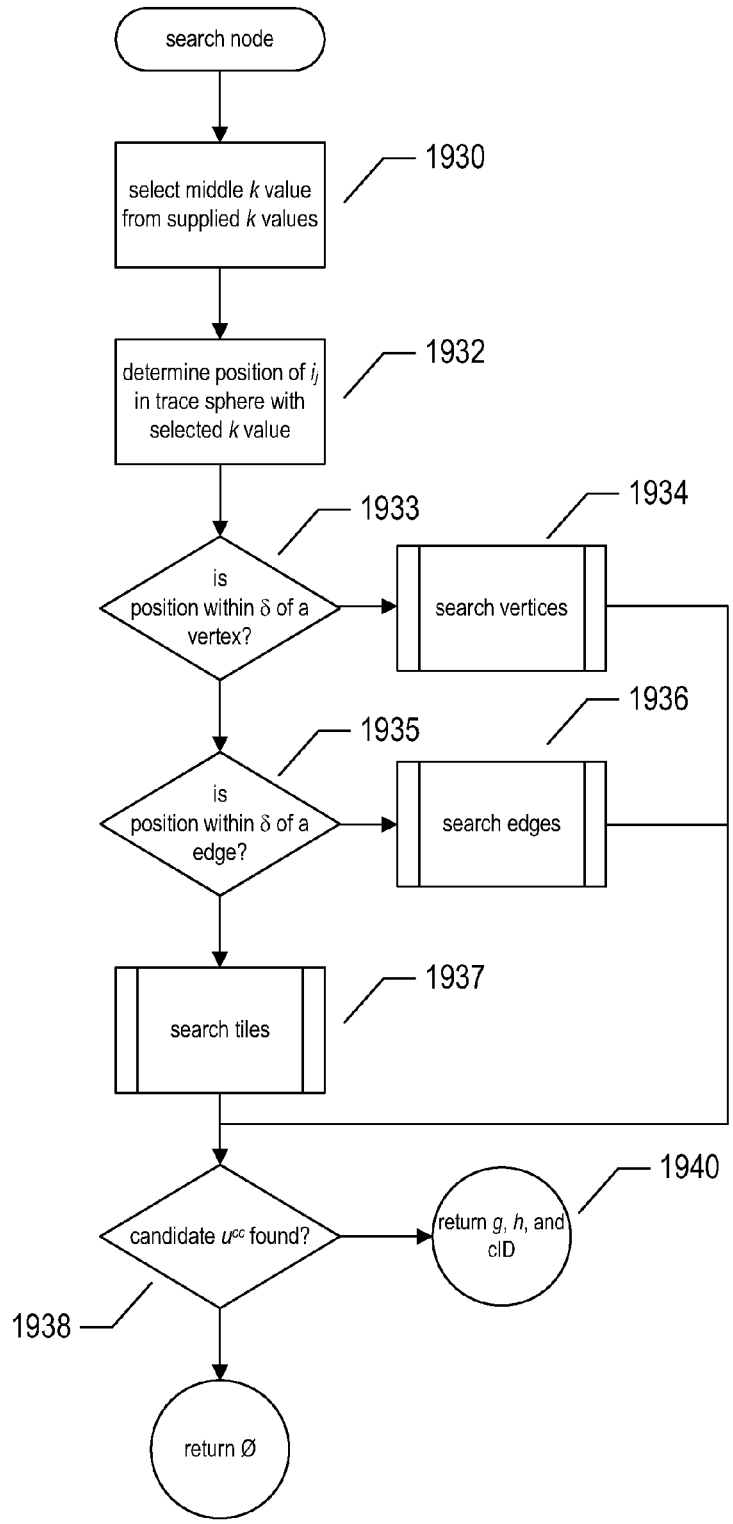

FIG. 19D provides a control-flow diagram of the routine "search node" called in step 1925 of FIG. 19C. In step 1930, the middle absolute trace value k from among the set of absolute trace values $k_i$ received as parameters is selected, a local variable "bestC" is initialized to the null value, and local variable "bC" is set to null, and a local variable "bCost" is set to some large value greater than the cost associated within a circuit that can be generated from a canonical-form circuits in $CC_x$. In step 1932, the position of the generated circuit $u'_j$ of a currently considered triple generated from u in the for-loop of steps 1906-1909 in FIG. 19A within the trace sphere associated with the selected k value is determined. This determination involves both a projection of $u'_j$ to a trace sphere as well as generation of a $V_3$ vector for that projection. When the determined position is within a distance $\epsilon$ of a vertex, as determined in step 1933, then the routine search vertices is called, in step 1934, to search all of the symmetry-equivalent neighborhoods within the trace sphere. Otherwise, when the determined position is within $\epsilon$ of an edge, as determined in step 1935, then the routine search edges is called, in step 1936. Otherwise, the routine "search tiles" is called in step 1937. When a candidate $u^{cc}$ is found in the search of a trace sphere or a small number of adjacent, concentric trace spheres, as determined in step 1938, then the design and the cost of the design are returned in step 1940.

Figure 19E:
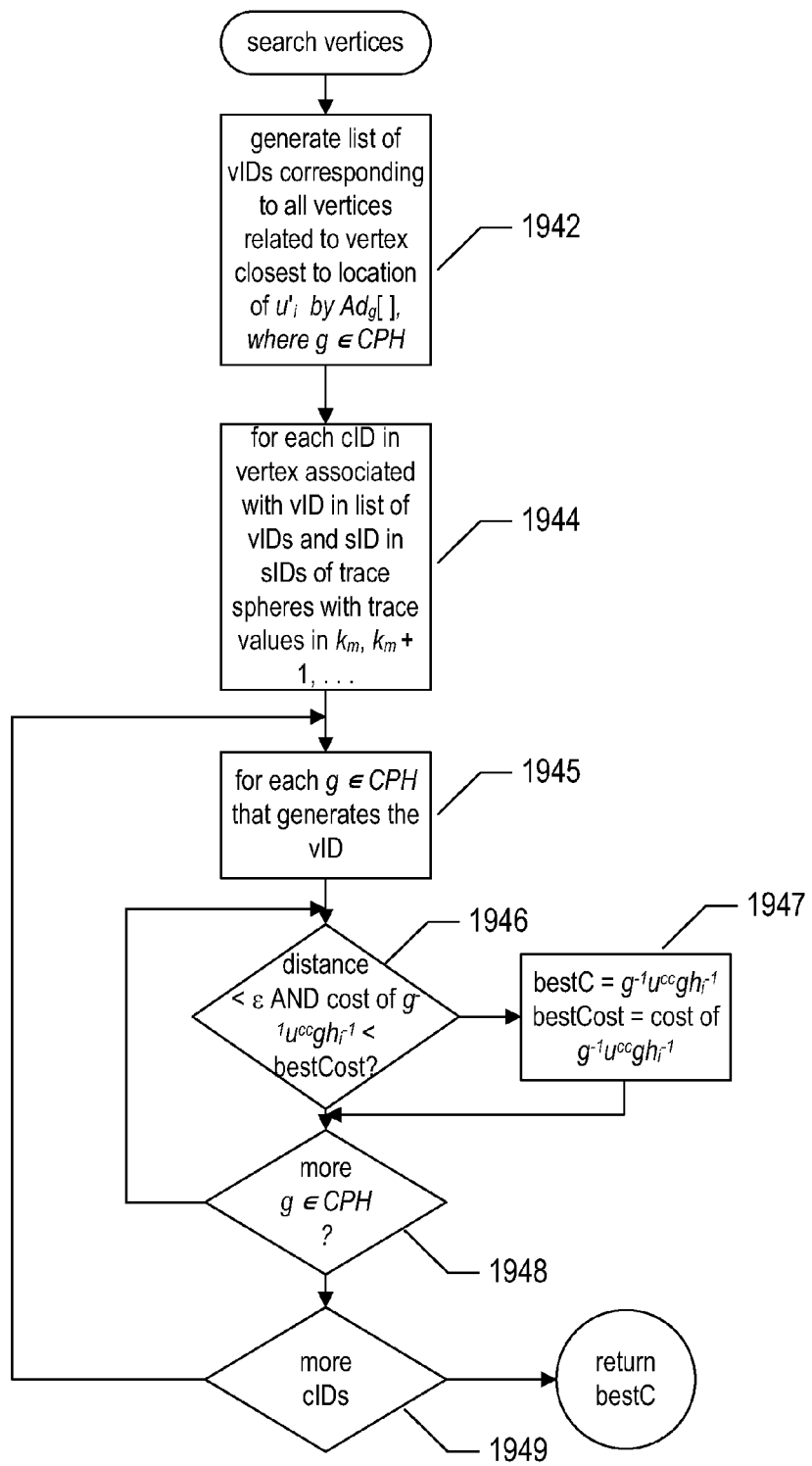

FIG. 19E provides a control-flow diagram for the routine "search vertices" called in step 1934 of FIG. 19D. In step 1942, a list of the vIDs corresponding to all vertices related to the vertex closest to the location of $u'_j$ by symmetry operator $Ad_g[\ ]$, where g∈CPH, is generated. Next, the nested for-loops of steps 1944-1949 considers all of the canonical-form circuits, identified by cID values, that are associated in the table "vertex associations" with a vertex with a vID in the list of vIDs generated in step 1942 and with an sID in a list of sIDs for trace spheres with absolute trace values in the list of absolute trace values passed to the routine search node. For each of these considered canonical-form circuits, each design generated from a member g of CPH used to generate the list of vIDs and from any of the members of CPH $h_t$ that generated absolute trace value in the for-loop of steps 1906-1909 in FIG. 19A, is considered in the inner nested for-loop of steps 1945-1947. When the distance from a considered design and u is less than ε and the cost of the design is less than the current valued stored in "bCost," then the currently considered design becomes the best design so far evaluated in step 1947.

The routine "search edges," called in step 1936 of FIG. 19D, is similar to the routine "search vertices," illustrated in FIG. 19E, with the exception that the list of vIDs is generated by the symmetry operator $Ad_g[\ ]$. Therefore, the routine "search edges" is not separately diagramed and discussed.

Figure 19F:
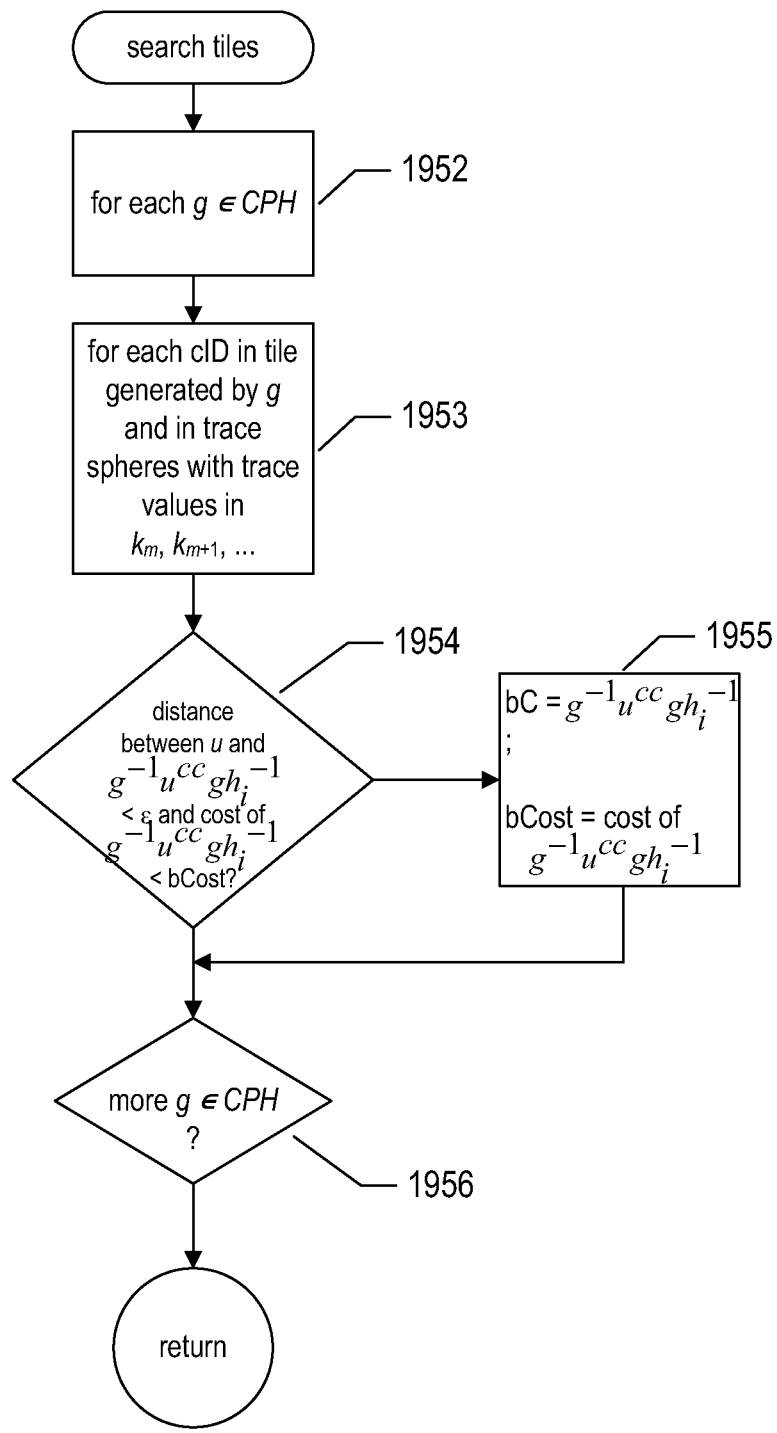

Finally, FIG. 19F provides a control-flow diagram for the routine "search tiles" called in step 1937 of FIG. 19D. In the nested for-loops of step 1952-1956, all of the canonical circuits associated with all of the tiles in the table tile associations within the trace spheres in the trace-level neighborhood being considered are considered. The design produced from a currently considered canonical-form circuit promoted to the best design so far evaluated, in step 1955, when cost of the design is lower than any design so far evaluated and the distance between u and the design is less than ε.

Returning to FIG. 19D, it is seen that the routine "search node" evaluates the projected position of a $u'_j$ generated by the right-coset operation to determine its relative position within a tile. When the relative position is close to a vertex, then all of the equivalent positions generated by symmetry operations are also close to vertices of the same kind, and so all of the search neighborhoods in the trace sphere or thin layer of adjacent, concentric trace spheres are located near the same type of vertex. Therefore, only vertex-associated canonical-form circuits need be considered. When the location generated by the right-coset operation is close to an edge, then only the canonical-form circuits in the trace sphere or adjacent, concentric trace spheres associated with symmetrically equivalent edges need be considered. Otherwise, when the location falls within the interior of a tile a sufficient distance away from any vertex or edge, then the canonical-form circuits associated with interiors of tiles are considered as candidates for generation of designs.

In a more computationally complex implementation, search neighborhoods may be more precisely defined as disk-shaped areas corresponding to spherical neighborhoods in trace space. However, computational overhead for determining a set of canonical circuits that fall within such spherical neighborhoods in trace space is significant. The currently described search based on vertex, edge, and tile associations can be implemented with a straightforward database organization, as shown in FIG. 18, and with relatively low computational complexity.

Although the present invention has been described in terms of particular embodiments, it is not intended that the invention be limited to these embodiments. Modifications within the spirit of the invention will be apparent to those skilled in the art. For example, various different implementations of the database-search-based quantum-circuit design methods and systems can be obtained by varying any of many different design and implementation parameters, including programming language, operating system, hardware platform, data structures, control structures, modular organization, and other such parameters. The database may be distributed across different numbers of system nodes, and the search methods may employ various different methods for identifying and searching neighborhoods within the trace space.

It is appreciated that the previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A computer-implemented method of synthesizing a design for a target quantum operation u in a standard-quantum-gate basis, the method comprising:
   receiving, by the computer system, the target quantum operation u;
   searching, by the computer system, a database of canonical-form quantum circuits to identify a canonical-form quantum circuit from which a minimum-cost design within a distance-metric-value distance to the target quantum operation u can be generated, wherein each canonical-form quantum circuit is represented as a sequence of representations of TH and SH gates that contains no adjacent SH gates, ends in TH, and in which no SH gate occurs before the fifth gate;
   generating, by the computer system, the minimum cost design from the identified canonical-form quantum circuit; and
   storing, by the computer system, the generated minimum-cost design in one or more of an electronic memory and physical data-storage device.

2. The method of claim 1, wherein the database of canonical-form quantum circuits is partitioned into one or more trace-level partitions, each associated with a range of absolute trace-level values.

3. The method of claim 2, wherein the trace-level partitions are distributed across multiple computational and data-storage nodes of a distributed quantum-circuit-design system.

4. The method of claim 1, wherein searching the database of canonical-form quantum circuits to identify the canonical-form quantum circuit from which the minimum-cost design within the distance-metric-value distance to the target quantum operation u can be generated further comprises:
   transforming the target quantum operation u by a right-coset operation followed by an adjoint operation to generate up to a first maximum number of search neighborhoods within a trace space; and
   searching the up to the first maximum number of search neighborhoods within the trace space to identify the minimum-cost design within the distance-metric-value distance to the target quantum operation u.

5. The method of claim 4, wherein:
   the right-coset operation generates up to a second maximum number of trace-level neighborhoods;
   the adjoint operation generates up to a third maximum number of symmetrically related search neighborhoods within each trace-level neighborhood; and the first maximum number of search neighborhoods is a product of the second and third maximum numbers.

6. The method of claim 4, wherein the right-hand coset and adjoint operations employ elements of the CPH group.

7. The method of claim 1, wherein generating the minimum cost design from the identified canonical-form quantum circuit further comprises applying an adjoint operation followed by a right-coset operation to the identified canonical-form quantum circuit.

8. A database-search-based quantum-circuit design system, comprising:
a number of distributed system nodes, each including one or more processors, one or more electronic memories, and one or more physical data-storage devices;
computer instructions stored in one or more electronic memories and physical data-storage devices within each system node that, when executed on the one or more processors within the system node, control the system node to receive a target quantum operation u;
search a portion of a database of canonical-form quantum circuits to identify a canonical-form quantum circuit from which a minimum-cost design within a distance-metric-value distance to the target quantum operation u can be generated, wherein each canonical-form quantum circuit is represented as a sequence of representations of TH and SH gates that that contains no adjacent SH gates, that ends in TH, and in which no SH gate occurs before the fifth gate; and
when the canonical-form quantum circuit is identified,
generate the minimum cost design from the identified canonical-form quantum circuit,
store the generated minimum-cost design in one or more of an electronic memory and physical data-storage device, and
provide an indication that the canonical-form quantum circuit is identified.

9. The database-search-based quantum-circuit design system of claim 8, wherein the database of canonical-form quantum circuits is partitioned into one or more trace-level partitions, each associated with a range of absolute trace-level values.

10. The database-search-based quantum-circuit design system of claim 9, wherein the trace-level partitions are distributed across the number of distributed system nodes.

11. The database-search-based quantum-circuit design system of claim 9, wherein the target quantum operation u is transformed by a right-coset operation to generate up to a first maximum number of trace-level neighborhoods and the up to the first maximum number of trace-level neighborhoods are each searched by one or more distributed system nodes.

12. The database-search-based quantum-circuit design system of claim 8, wherein a distributed system node searches a trace-level neighborhood by:

transforming the target quantum operation u transformed by the right-coset operation by an adjoint operation to generate up to a second maximum number of search neighborhoods within a trace space; and
searching the up to the second maximum number of search neighborhoods within the trace space to identify the minimum-cost design within the distance-metric-value distance to the target quantum operation u.

13. The database-search-based quantum-circuit design system of claim 12, wherein the right-hand coset and adjoint operations employ elements of the CPH group.

14. The database-search-based quantum-circuit design system of claim 8, wherein a distributed system node generates the minimum cost design from the identified canonical-form quantum circuit by applying an adjoint operation followed by a right-coset operation to the identified canonical-form quantum circuit.

15. The database-search-based quantum-circuit design system of claim 8, wherein the database-search-based quantum-circuit design system selects as a design for the target quantum operation u the minimum-cost design identified by the distributed system nodes.

16. The database-search-based quantum-circuit design system of claim 8, wherein each canonical-form quantum circuit is represented as a sequence of representations of TH and SH gates and is associated with a corresponding normal representation having the same number of TH gates as the canonical-form circuit.

17. A database-search-based quantum-circuit design system, comprising:
one or more processors, one or more electronic memories, and one or more physical data-storage devices; and
computer instructions stored in one or more electronic memories and physical data-storage devices that, when executed on the one or more processors, control the system to:
receive the target quantum operation u;
search a database of canonical-form quantum circuits to identify a canonical-form quantum circuit from which a minimum-cost design within a distance-metric-value distance to the target quantum operation u can be generated, wherein each canonical-form quantum circuit is represented as a sequence of representations of TH and SH gates that that contains no adjacent SH gates, ends in TH, and in which no SH gate occurs before the fifth gate;
generate the minimum cost design from the identified canonical-form quantum circuit; and
store the generated minimum-cost design in one or more of an electronic memory and physical data-storage device.

* * * * *